United States Patent
Marinella et al.

(10) Patent No.: US 9,761,675 B1
(45) Date of Patent: Sep. 12, 2017

(54) RESISTIVE FIELD STRUCTURES FOR SEMICONDUCTOR DEVICES AND USES THEROF

(71) Applicant: National Technology & Engineering Solutions of Sandia, LLC, Albuquerque, NM (US)

(72) Inventors: Matthew Marinella, Albuquerque, NM (US); Sandeepan DasGupta, State College, PA (US); Robert Kaplar, Albuquerque, NM (US); Albert G. Baca, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 14/989,633

(22) Filed: Jan. 6, 2016

Related U.S. Application Data

(60) Provisional application No. 62/101,311, filed on Jan. 8, 2015.

(51) Int. Cl.
| | |
|---|---|
| H01L 23/62 | (2006.01) |
| H01L 29/40 | (2006.01) |
| H01L 29/778 | (2006.01) |
| H01L 29/20 | (2006.01) |
| H01L 29/205 | (2006.01) |
| H01L 49/02 | (2006.01) |
| H01L 23/31 | (2006.01) |
| H01L 27/06 | (2006.01) |

(52) U.S. Cl.
CPC ........ *H01L 29/405* (2013.01); *H01L 23/3171* (2013.01); *H01L 27/0629* (2013.01); *H01L 28/20* (2013.01); *H01L 29/2003* (2013.01); *H01L 29/205* (2013.01); *H01L 29/7787* (2013.01)

(58) Field of Classification Search
CPC ............... H01L 23/3171; H01L 29/405; H01L 29/2003; H01L 29/205; H01L 29/7787; H01L 28/20
USPC .................................................... 257/76, 360
See application file for complete search history.

(56) References Cited

U.S. PATENT DOCUMENTS

| | | | |
|---|---|---|---|
| 2010/0118455 A1* | 5/2010 | Kusunoki | ....... H01L 21/823878 361/56 |
| 2015/0263107 A1* | 9/2015 | Kobayashi | ............ H01L 29/404 257/367 |

OTHER PUBLICATIONS

Das Gupta, S., et al., "A Distributed Impedance "Field Cage" for Improved Breakdown Voltage Scalability in AlGaN/ 3aN HEMTs", SAND2013-7138J, 2013.*

(Continued)

*Primary Examiner* — Vongsavanh Sengdara
(74) *Attorney, Agent, or Firm* — Martin I. Finston

(57) ABSTRACT

The present disclosure relates to resistive field structures that provide improved electric field profiles when used with a semiconductor device. In particular, the resistive field structures provide a uniform electric field profile, thereby enhancing breakdown voltage and improving reliability. In example, the structure is a field cage that is configured to be resistive, in which the potential changes significantly over the distance of the cage. In another example, the structure is a resistive field plate. Using these resistive field structures, the characteristics of the electric field profile can be independently modulated from the physical parameters of the semiconductor device. Additional methods and architectures are described herein.

10 Claims, 16 Drawing Sheets

(56) References Cited

OTHER PUBLICATIONS

Asano, T. et al., "Breakdown Characteristics in AlGaN/GaN HEMTs with Multi-Field-Plate Structure", IEEE International Meeting for Future of Electron Devices, Kansai (IMFEDK), May 9-11, 2012, 2 pages.
Baliga, B. J. et al., "Semiconductors for High-Voltage, Vertical Channel Field Effect Transistors", J. Appl. Phys., 1982, p. 1759, vol. 53.
Boico, F. et al., "Solar Magic SM73201 DC Arc Detection Evaluation Board", National Semiconductor Corporation, 2011, Application Note 2154.
Chiang, C. et al., "Effect of Field Plate on the RF Performance of AlGaN/GaN HEMT Devices", Physics Procedia, 2012, pp. 86-91, vol. 25.
Cho, K. et al., "Design of AlGaN/GaN HEMTS Employing Mesa field Plate for Breakdown Voltage Enhancement", Solid-State Electronics, 2010, pp. 405-409, vol. 54.
Das, J. et al., "A 96% Efficient High-Frequency DC-DC Converter Using E-Mode GaN DHFETs on Si", IEEE Electron Device Letters, 2011, p. 1370, vol. 32.
Dasgupta, S., et al., "A Distributed Impedance "Field Cage" for Improved Breakdown Voltage Scalability in AlGaN/GaN HEMTs", SAND2013-7138J, 2013.
Dora, Y. et al., "High Breakdown Voltage Achieved on AlGaN/GaN HEMTs with Integrated Slant Field Plates", IEEE Electron Devices Letters, 2006, p. 713, vol. 27.
Karmalkar, S. et al., "Very High Voltage AlGaN/GaN High Electron Mobility Transistors Using a Field Plate Deposited on a Stepped Insulator," Solid-State Electronics, 2001, pp. 1645-1652, vol. 45.
Karmalkar, S. et al., "Enhancement of Breakdown Voltage in AlGaN/GaN High Electron Mobility Transistors Using a Field Plate", IEEE Transactions on Electron Devices, 2001, p. 1515, vol. 48.
Karmalkar, S. et al., "Field-Plate Engineering for HFETs", IEEE Transactions on Electron Devices, 2005, p. 2534, vol. 52.
Lee, J.-G. et al., "Field Plated AlGaN/GaN-on-Si HEMTs for High Voltage Switching Applications", Journal of the Korean Physical Society, 2011, pp. 2297-2300, vol. 59.
Li, J. et al., "Optical and Electrical Properties of Mg-doped, p-type $Al_xGa_{1-x}N$", Applied Physics Letters, 2002, p. 1210, vol. 80.
Lu, B. et al., "High Breakdown (>1500 V) AlGaN/GaN HEMTs by Substrate-Transfer Technology", IEEE Electron Device Letters, 2010, p. 951, vol. 31.
Nakarmi, M. L. et al., "Enchanced p-type conduction in GaN and AlGaN by Mg-δ-doping", Applied Physics Letters, 2003, p. 3041, vol. 82.
Onodera, H. et al., "Analysis of Buffer-Impurity and Field-Plate Effects on Breakdown Characteristics in Small-Sized AlGaN/GaN High Electron Mobility Transistors", Semiconductor Science and Technology, 2012, 085016, vol. 27.
Saito, W. et al., "Influence of Surface Defect Charge at AlGaN—GaN-HEMT Upon Schottky Gate Leakage Current and Breakdown Voltage", IEEE Transactions on Electron Devices, 2005, p. 159, vol. 52.
Tipirneni, N. et al., "The 1.6kV AlGaN/GaN HFETs", IEEE Electron Device Letters, 2006, p. 716, vol. 27.
Wu, Y.-F. et al., "30-W/mm GaN HEMTs by Field Plate Optimization", IEEE Electron Device Letters, 2004, p. 117, vol. 25.
Wu, Y. et al., "A 97.8% Efficient GaN HEMT Boost Converter with 300-W Output Power at 1 MHz", IEEE Electron Device Letters, 2008, p. 824, vol. 29.
Xie, G. et al., "Breakdown Voltage Enhancement for Power AlGaN/GaN HEMTs with Air-bridge Field Plate", Proceedings of the 2012 24th International Symposium on Power Semiconductor Devices and ICs, Jun. 3-7, 2012, Bruges, Belgium.
Xing, H. et al., "High Breakdown Voltage AlGaN—GaN HEMTs Achieved by Multiple Field Plates", IEEE Electron Device Letters, 2004, p. 161, vol. 25.
Zhang, N.-Q. et al., "Kilovolt AlGaN/GaN HEMTs as Switching Devices", 2001, Phys. Stat. Sol., 2001, pp. 213-217, vol. 188.

\* cited by examiner

Gate Field Cage

Drain Field Cage

Basic Design
The electric field is concentrated on the Gate field plate tip

RESISTIVE FIELD STRUCTURES FOR SEMICONDUCTOR DEVICES AND USES THEROF

CROSS-REFERENCE TO RELATED APPLICATION

This application claims priority to U.S. Provisional Patent Application No. 62/101,311, filed on Jan. 8, 2015 under the title, "RESISTIVE FIELD STRUCTURES FOR SEMICONDUCTOR DEVICES AND USES THEREOF," the entirety of which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the disclosure.

FIELD

The present disclosure relates to resistive field structures (e.g., cages or plates) for semiconductor devices (e.g., high voltage transistors, such as high electron mobility transistors (HEMTs), as well as charge control devices, such as diodes). In particular, the resistive field structures provide improved electric field profiles across the active volume of a semiconductor device. Methods of making and using such field structures are also described herein.

BACKGROUND

Semiconductor field effect devices (e.g., field effect transistors) or semiconductor junction-based charge control devices (e.g., diodes, thyristors, bipolar junction transistors, etc.) must be designed with careful consideration and control of the electric fields in specific regions of the device volume during operation. For example, a key parameter for a semiconductor device of given physical device dimensions is known as the breakdown voltage ($V_{br}$). This voltage is taken between the two terminals through which all or most of the electric current flows, such as between the source and drain. Voltage across these terminals can cause the electric field in certain areas of the active device volume to exceed a material-dependent value (known as the critical field $E_{crit}$). When $E_{crit}$ is exceeded, excessive current flows through the device. Hence, this maximum voltage where excessive current flows ($V_{br}$) depends directly on the maximum electric fields attained in the active device volume at a given terminal voltage.

Theoretically, modern high voltage transistors have the potential to be developed as a power switching device for some of the highest voltage applications. For example, the material properties of GaN and AlN, which are generally employed in high electron mobility transistors (HEMTs), should allow for high voltage power switching. In reality, non-uniform charge distribution and the HEMT architecture prevent this from being realized. The non-uniform electric field distribution leads to the critical field $E_{crit}$ being exceeded for voltages much smaller than predicted by the unipolar critical field. Once the critical field is exceeded, no further improvement in $V_{br}$ can be realized by increasing the gate to drain spacing.

To address these issues in non-uniform electric field distribution, modern high voltage transistors typically use a field plate to decrease the maximum electric field $E_{crit}$ attained in the device volume for a given set of terminal voltages and device dimensions, and hence increase $V_{br}$ for given device dimensions. The traditional field plate is made from a conductive material with a minimal change in potential over the length of the field plate. Such field plates generally vary in physical structural features (e.g., vary in field plate geometry, the number of field plates, or the spacing between two or more plates) and, thus, can be limited by physical scalability issues. For instance, the horizontal spacing between field plates can be controlled to enhance field sharing (e.g., by decreasing the horizontal spacing) but at the cost of reducing electric field peaks near the gate. Vertical spacing of field plates can result in a more uniform electric field but must be accommodated within a small height from the device surface. Thus, additional apparatuses are needed that have improved control over electric field distribution, especially for high voltage devices and applications. In particular, apparatuses that are not limited by physical structural features of field plates would be greatly beneficial.

SUMMARY

Accordingly, the present disclosure relates to a resistive field structures for providing improved electric field distribution in semiconductor devices. Such field structures are composed of resistive materials or elements that provide significant potential changes over the distance of the structure.

In particular, described herein are a number of electric-field-control methods in lateral GaN-based power transistors for enhanced breakdown voltage and improved reliability. For lateral devices, several approaches to field control were investigated in simulation, including the resistive field cage, the resistive field plate, and the lateral variation of charge. Experimentally, materials suitable for resistive field plate fabrication were fabricated, and the effects of the electric field on device reliability were investigated. Control of the electric field and the commensurate high breakdown voltage are particular beneficial for III-N power devices that will be applicable to a broad range of improvements, such as improved Size, Weight, and Power (SWaP).

In one embodiment, the resistive field structure is a field cage, which in turn employs a multi-contact voltage-distributed field control scheme. In this manner, the characteristics of the electric field profile can be independently modulated from the physical parameters of the semiconductor device. In another embodiment, the resistive field structure is a field plate composed of a highly resistive material (e.g., a resistivity greater than about $10^6$ Ω·cm, such as a resistivity of from about $10^6$ Ω·cm to about $10^8$ Ω·cm).

In other embodiments, the field structure is configured to be resistive, in which the potential changes significantly over the distance or length of the structure. In some embodiments, the field structure is configured to have a significant potential change on the surface of the structure, which will cause a change in electric field external to the structure surface. The existence of electric potential variation on the surface and within the body of the length of this structure implies that during gate biasing, a non-negligible current will flow through the structure.

In some embodiments, the resistive field structure is used in combination with a semiconductor device (e.g., a semiconductor junction or field-effect based charge controlling device) to control the electrical field of the semiconductor device (e.g., in the active volume, or a portion thereof, of the semiconductor device). In other embodiments, the resistive field structure is configured to increase the maximum breakdown field and, therefore, the maximum terminal breakdown voltage of a semiconductor device of a given set of dimensions. Additional details are described herein.

Definitions

As used herein, the term "about" means +/−10% of any recited value. As used herein, this term modifies any recited value, range of values, or endpoints of one or more ranges.

As used herein, the term "disposed" means that a first structure is indirectly or directly in contact with a second structure. When a first structure is disposed above a second structure, the first structure can be in direct physical contact with the surface of the second structure or in indirect contact with the surface of the second structure (e.g., by use of one or more intermediate layers).

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the disclosure will be apparent from the following description and the claims.

BRIEF DESCRIPTION OF THE DRAWINGS

FIG. 1B is a schematic of drain field cage taps $T_{n-1}$, $T_n$, $T_{n+1}$, and $T_{n+2}$ and various dimensions, such as pitch (the distance between the center of two consecutive field taps), $d_{tap}$ (the distance between the edge of two consecutive field taps), $L_{tap}$ (the length of the field tap), $L_g$ (the length of the gate) and $h_{pass}$ (the height of the passivation layer); FIG. 1C is a schematic of drain field cage taps $T_{n-1}$, $T_n$, $T_{n+1}$, and $T_{n+2}$ connected to resistive elements $R_{n-1}$, $R_n$, $R_{n+1}$, and $R_{n+2}$ and with voltages $V_{n-1}$, $V_n$, $V_{n+1}$, and $V_{n+2}$; and FIG. 1D is a graph showing achieved electric field profile for $V_{ds}$=500 V. Data are provided for drain 6 tap, $L_{tap}$=800 nm, $d_{tap}$=200 nm (labeled "i"); drain 6 tap, $L_{tap}$=600 nm, $d_{tap}$=400 nm (labeled "ii"), and gate 6 tap, $L_{tap}$=800 nm, $d_{tap}$=200 nm (labeled "gate").

FIG. 2B which is an illustration of a field plate 2050 disposed between the gate 230 and the drain 220 but electrically connected to the source 210; FIG. 2C which is an illustration of an extended field plate 2150 electrically connected to the source 210; and FIG. 2D which is an illustration of a charge variation layer 2501 disposed between the gate 230 and the drain 220.

FIG. 3C-3D provides electric field profiles from source to drain for the structure in FIGS. 3A and 3B, respectively. FIG. 3C shows data for horizontal spacing between field plates F1, F2, and F3 to be 250 nm (labeled "i"), 500 nm (labeled "ii"), and 700 nm (labeled "iii"). FIG. 3D shows data for vertical spacing between the AlGaN surface and field plate F3 to be 50 nm (labeled "i"), 150 nm (labeled "ii"), 250 nm (labeled "iii"), and 450 nm (labeled "iv"), as well as a reference curve for an HEMT having two field plates (dashed line, labeled "2 Field Plate").

FIG. 7A shows a schematic for three consecutive field cage taps $T_{n-1}$, $T_n$, and $T_{n+1}$ with corresponding voltages V, $V_n$, and $V_{n+1}$. For all R, the resistance was 1 GΩ. FIG. 7B shows graphs for the voltage difference between consecutive taps as a fraction of $V_{ds}$ (used as a measure of uniformity in the electric field distribution), FIG. 7C shows graphs for electric field profiles from source to drain for $V_{ds}$=500 V (dV/dt=100 V/ns) for the structure with two differently spaced drain field cages, with tap pitch=1 μm and $d_{tap}$=100 nm and 400 nm, and FIG. 7D shows graphs for electric field profiles in the horizontal direction (from source to drain) at the surface of the dielectric passivation between consecutive taps for the $d_{tap}$=100 nm case. $h_{pass}$=100 nm for all structures.

FIG. 9B shows graphs for electric field profiles from source to drain for $V_{ds}$=500 V (dV/dt=100 V/ns) for a drain field cage with tap pitch=1 μm and $d_{tap}$=400 nm and $h_{pass}$ being 100 nm (labeled "i"), 400 nm (labeled "ii"), and 500 nm (labeled "iii"); and FIG. 9C shows graphs for electric field profiles in the horizontal direction (from source to drain) at the surface of passivation between consecutive taps for $d_{tap}$=400 nm.

FIG. 13A is a cross-sectional view of a semiconductor device according to one or more embodiments. FIG. 13B is a cross-sectional view of a semiconductor device according to one or more embodiments. FIG. 13C is a cross-sectional view of a semiconductor device according to one or more embodiments. FIG. 13D is a cross-sectional view of a semiconductor device according to one or more embodiments. FIG. 13E is a cross-sectional view of a semiconductor device according to one or more embodiments. FIG. 13F is a cross-sectional view of a semiconductor device according to one or more embodiments. FIG. 13G is a cross-sectional view of a semiconductor device according to one or more embodiments.

FIG. 18B which is a contour plot showing the magnitude of the electric field resulting from one implementation of the LCV concept, where the polarization charge was increased in a step-wise fashion from the gate to the drain; and FIG. 18C which is a graph showing the electric field magnitude plotted along a cutline in the GaN (see inset) for basic HEMT, the RFP design, and the LCV design.

DETAILED DESCRIPTION

Figure 1A:
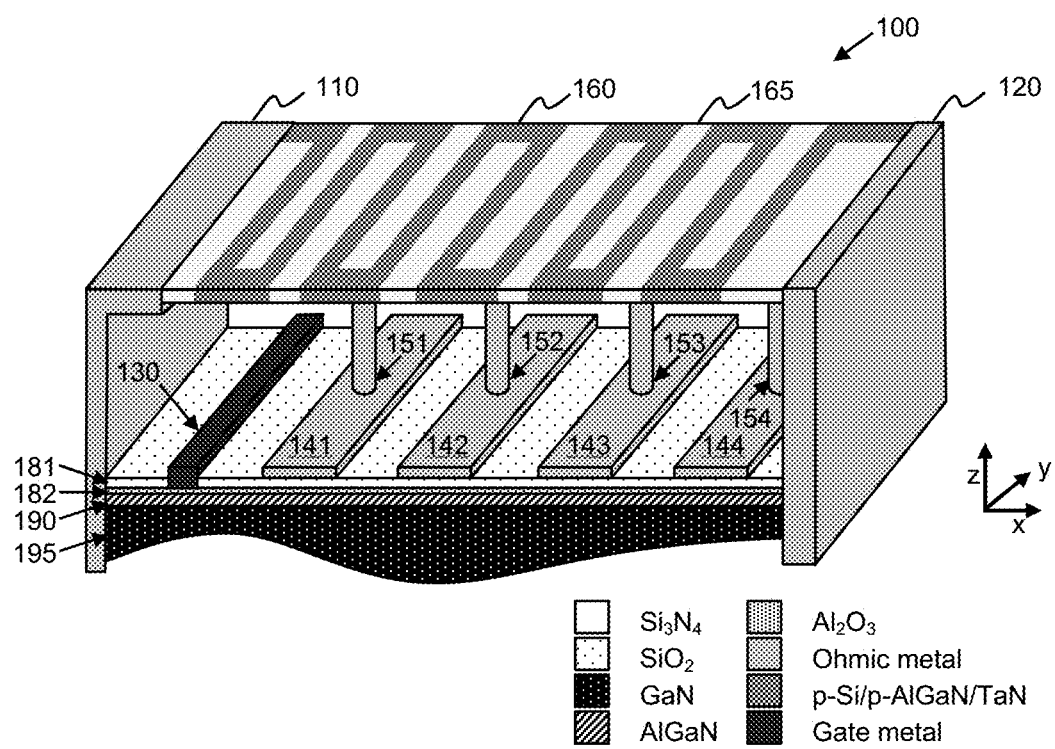
FIG. 1A-1D shows an exemplary apparatus having a drain field cage employing a resistive voltage divider. Shown are FIG. 1A which is an illustration of a perspective view of the apparatus 100 having field taps 141-144 electrically connected to a resistive element 160, thereby forming the drain field cage.
Figure 2A:
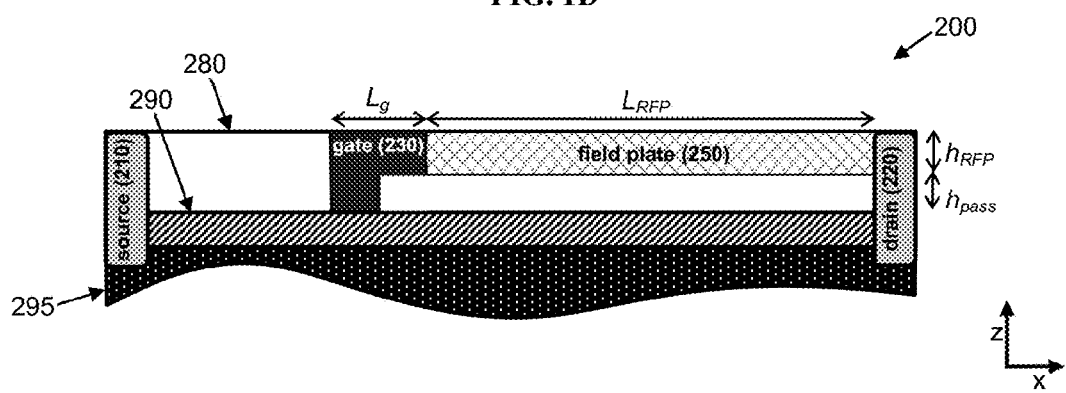
FIG. 2A-2D shows an exemplary apparatus having a resistive field plate. Shown are FIG. 2A which is an illustration of a field plate 250 extending between the gate 230 and the drain 220.
Figure 2B:
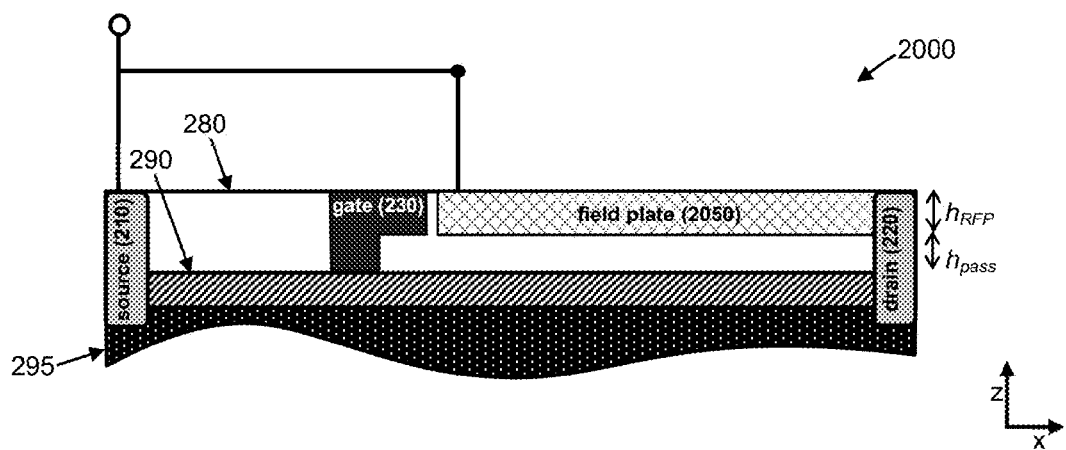

The present disclosure relates to a resistive field structure, which can be used in combination with a semiconductor device, to enhance electric field distribution. Exemplary field structures include a resistive field cage and a resistive field plate. For instance, FIG. 1A provides an exemplary field cage including a resistive element 160 and a plurality of field cage taps 141-144 that is electrically coupled to the resistive element 160 and disposed between the gate 130 and the drain 120. In another instance, FIG. 2A-2B provides an exemplary field plate 250, 2050 disposed, at least, between the gate 230 and the drain 220. The field plate can either be electrically connected to the gate (e.g., as in FIG. 2A) or to the source (e.g., as in FIG. 2B-2C). Additional details follow.

Resistive Field Cage

In some embodiments, the present disclosure includes the use of a resistive field cage, which in turn includes a resistive element and field cage taps. FIG. 1A provides an exemplary apparatus 100 having a resistive field cage and a semiconductor device. The resistive field cage includes a plurality of field cage taps 141-144 that is electrically coupled to a resistive element 160 by a plurality of contacts 151-154. The resistive element 160 is optionally embedded in an insulating substrate 165.

To obtain optimal impedance characteristics, the structure, geometry, and composition of the resistive element can be optimized (e.g., as described herein). In certain embodiments, the resistive element includes a structure of sufficient geometry (e.g., a serpentine structure, as shown in FIG. 1A), length (e.g., in the x-y plane in FIG. 1A), width (e.g., in the x- or y-axis in FIG. 1A), and/or thickness (e.g., in the z-axis in FIG. 1A) configured to provide sufficient impedance that minimizes power dissipation (e.g., about 1% or less) in the OFF-state dissipation in the semiconductor device. In further embodiments, the resistive element includes one or more structural dimensions (e.g., geometry, length, width, and/or thickness) to provide sufficient current leakage through the semiconductor device, thereby allowing resistive operation of the field cage to be independent of the structural features of the semiconductor device. Other design considerations for the resistive element, including resistive materials, are described herein.

For use of the field cage with a semiconductor device, the resistive element can be configured to be electrically connected to the source and/or drain of the semiconductor device. For instance, as shown in FIG. 1A, the resistive element 160 is electrically connected to the ohmic metal of the source 110 and the drain 120 (e.g., by one or more contacts, contact pads, etc.). In some embodiments, the resistive field cage is not electrically connected to the gate 130.

The semiconductor device can include any number of useful structures. In FIG. 1A, the semiconductor device is a HEMT having a passivation layer 181, an insulator layer 182, a barrier layer 190, and a buffer layer 195. Generally, these layers are deposited on a base substrate (e.g., silicon, such as SiC). These layers can be composed of any useful material(s). Exemplary materials include any described herein, such as GaN (e.g., for the buffer layer), AlGaN (e.g., for the barrier layer), as well as SiN, $SiO_2$, or $Al_2O_3$ (e.g., for the passivation layer, which can include a passivation stack of any of these materials, as described herein). Additional features of the semiconductor device are described herein.

Resistive Field Cage Taps

The field cage taps are used to electrically couple the resistive element to a surface of the semiconductor device. A tap generally includes a base structure (e.g., a rectangular bar, as in FIG. 1A) configured to contact a surface of the semiconductor device. This contact ensures that the tap distributes the electric field profile across the region of interest, i.e., the active region for the device. In some embodiments, this surface is the uppermost layer, such as the passivation layer, of the active region for the semiconductor device.

The base structure of the tap is electrically connected to the resistive element. This electrical connection can include any useful structure described herein, such as a contact, wire, post, etc. Each tap and each electrical connection between the tap and the resistive element can be formed from any useful material, such as an ohmic metal (e.g., any described herein). The number and type of electrical connections, as well as dimension and composition of the electrical connection, can also be optimized.

A plurality of taps can be arrayed to provide a particular voltage boundary condition in the active region of the semiconductor device. For instance, the field cage can include n number of taps, where each $n^{th}$ tap can be connected to an $n^{th}$ resistor. The plurality of n resistors makes up the resistive element. Each tap can be arranged to contact the top surface of the semiconductor device between the source and the drain. The distance between each tap can be optimized to provide a uniform electric field profile. The resistance of each resistor can be the same or different. In particular embodiments, each resistor has a resistance of about 1 GΩ. In other embodiments, each resistor is arranged in series. In some embodiments, a plurality of n field cage taps is configured to provide a gradually varying voltage boundary condition at a top surface of the semiconductor device.

Other parameters include those relating to an array of a plurality of taps, such as the dimension of an array of taps, including pitch and $d_{tap}$; the geometric arrangement of the taps, such as an n×m array, where n and m, independently, is an integer between 1 and 20; and the distance of one or more taps from the gate.

Figure 1B:
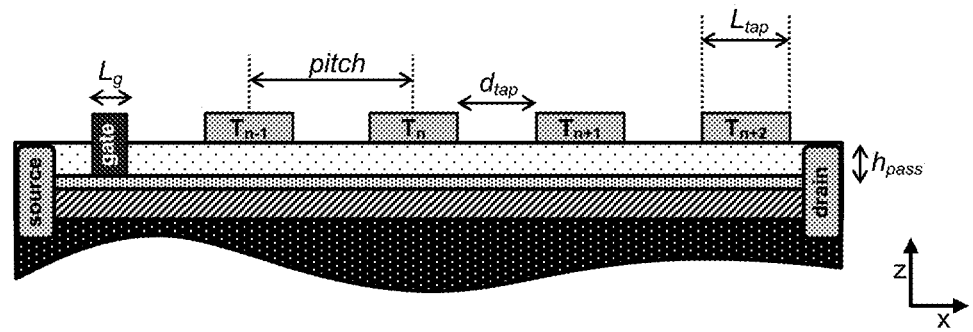
Figure 1C:
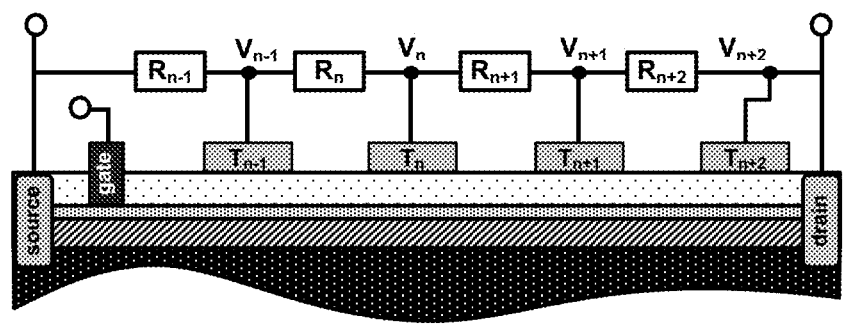
Figure 1D:
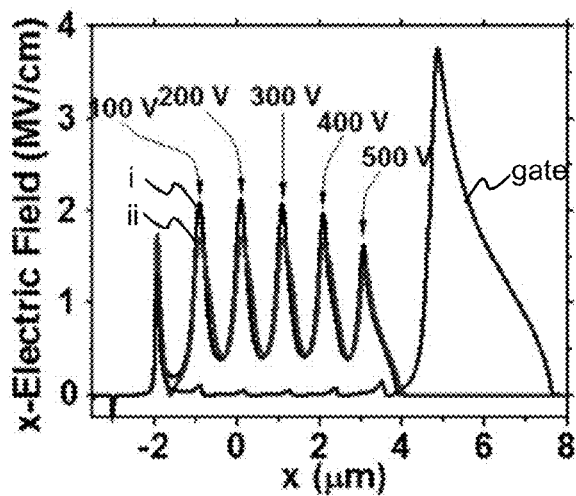

Various parameters related to the field cage taps can also be optimized to provide a more uniform electric field distribution. For instance, FIG. 1D shows the achieved electric field for a drain to source terminal voltage drop $(V_{ds})$=500 V. The Technology Computer Aided Design (TCAD) simulation shows equally spaced, equal height voltage peaks, adjustable by varying the dimensions of the structure, e.g., such as pitch, $d_{tap}$, and $L_{tap}$ for the field cage (see FIG. 1B). This is the essential criterion for achieving voltage scalable designs in power electronics at grid level voltages.

Exemplary parameters for the field cage taps include a dimension of tap, including tap length $L_{tap}$ (e.g., in the x-axis for FIG. 1B), tap height (e.g., in the z-axis for FIG. 1B), tap width (e.g., in the y-axis in FIG. 1A); and the geometry of tap, such as rectangular bars (e.g., in FIG. 1A) but could be other shapes, including discs, squares, etc. The number of taps n can be any useful integer, such as 2 or more.

Resistive Elements

The resistive field structure of the disclosure can include a resistive element. The resistive element includes a resistive material (e.g., as described herein) that is electrically connected to at least the source of the semiconductor device. In addition, the resistive element can include a plurality of resistors. Additional details follow.

For the resistive element, the choice of the resistance is based on numerous considerations. First, the resistive element should have high enough impedance to make the power dissipation a negligible fraction of OFF-state dissipation in the nominal semiconductor device. For example, the current though the resistor can be about 1% of the nominal OFF-state current. Second, the impedance should be large enough to not let the resistance be loaded by the active device. For instance, the current through the resistor should be higher than current leakage through the passivated device surface, thereby ensuring that resistive operation of the field structure is independent of the characteristics of the semiconductor device. In particular embodiments, the resistive element has a resistive of several GΩ. FIG. 1C shows an exemplary drain field cage with a resistive element having a plurality of resistors (i.e., resistors $R_{n-1}$, $R_n$, $R_{n+1}$, and $R_{n+2}$).

The physical parameters of the resistive element or resistor(s) can be optimized to provide significant potential changes over the distance of the resistive field structure. For instance, the length, width, and height of the resistive element can be configured to provide the required resistance. In particular, silicon is a material with well-developed technology for controlling physical parameters and fabricating ohmic contacts. For example and without limitation, a 100 nm×100 nm bar of p-type silicon doped at $10^{16}$ $cm^{-3}$ has a resistance of 1.25 GΩ/mm, assuming a hole mobility of 500 $cm^2$/Vs. To realize a 5 GΩ field cage as described herein, such a resistive element in silicon would have to be 4 mm long, resulting in a field of 1.25 kV/cm in silicon, well below the breakdown voltage of 300 kV/cm. In a similar manner, a skilled artisan would be able to optimize and test various aspects of the resistive element for use in the present disclosure.

The geometry of the resistive elements or resistors can provide particular resistance characteristics. For instance and without limitation, to accommodate a resistive element of sufficient length within the space between the source and drain, the geometry of the resistive element can include a serpentine structure. In certain embodiments, the resistive element includes a serpentine structure (e.g., as shown in FIG. 1A) of sufficient length (e.g., in the x-y plane in FIG. 1A) and/or thickness (e.g., in the z-axis in FIG. 1A) configured to provide sufficient impedance that minimizes power dissipation in the OFF-state dissipation in the semiconductor device and to reduce resistance loading by the active semiconductor device. In some embodiments, the serpentine structure includes a ~20 nm thick film formed from Si, p-AlGaN, and/or TaN.

In some embodiments, the resistive element includes a resistive material in a thin film patterned on an insulating substrate, e.g., an $Al_2O_3$ layer.

The resistive element can be electrically connected to the semiconductor device in any useful manner. For instance, the resistive element contacts may be routed to the individual device fingers using vias and a two metal level scheme. For a 500 V device carrying ~10-20 A of current, the standard die size is ~0.5 cm×0.5 cm, and hence the area required by the resistive element is a very small fraction (less than 0.1%) of the die area.

Other design considerations can be incorporated into the resistive element. For instance, the resistive element can be configured to minimize thermal fluctuations and/or coupling with the electric fields in the device. Such configurations could include, e.g., a resistive element formed by etching a portion of the buffer layer in a region along the edge of a die for the semiconductor device, thereby exposing the base substrate; and fabricating the resistive element in the exposed region by implant doping. Other considerations include the ease of making ohmic contacts between the resistive material and other structures (e.g., the source, drain, gate, and/or insulating substrate), the material characteristics (e.g., breakdown voltage), and the compatibility of the resistive material to the fabrication processes and materials for the remaining portion of the apparatus.

Methods of testing the resistive field structure include obtaining electrical field profiles, as described herein.

Resistive Field Plate

In other embodiments, the present disclosure includes use of a resistive field plate. FIG. 2A provides an exemplary apparatus 200 having a resistive field plate 250 disposed between the gate 230 and the drain 220. Optionally, the gate 230 can include a vertical portion (having an extended dimension along the z-axis) that is in contact with an active layer of the device (e.g., a barrier layer 290), as well as a horizontal portion (having an extended dimension along the x-axis) having a length $L_g$, as shown in FIG. 2A.

The resistive field plate (RFP) can have any useful geometry and electrical connectivity. For instance, the RFP can be a planar, deposited material located between the gate and the drain. The height of the RFP $h_{RFP}$ and the passivation layer $h_{pass}$ (along the x-direction in FIG. 2A-2D) can be optimized to reduce switching times (e.g., according to Eq. 3, as described herein).

Figure 2C:
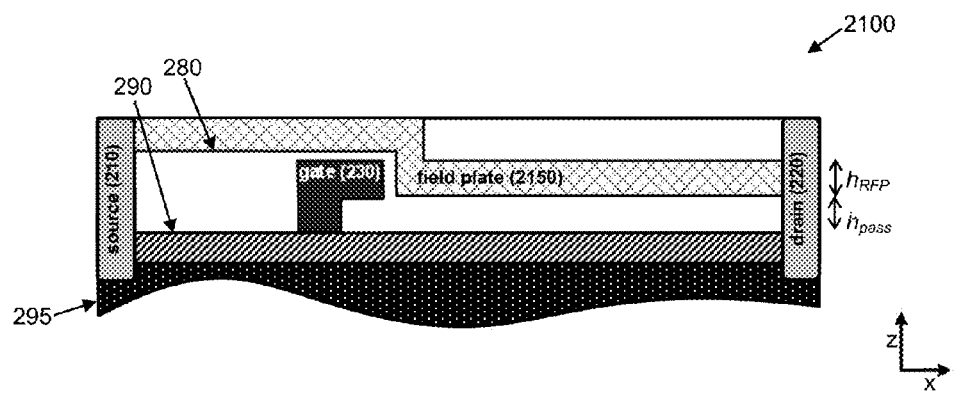

Electrical connectivity can be optimized to ensure a uniform electrical field distribution, provide a low switching time, as well as to minimize power loss in the OFF state and during switching between ON and OFF states for the device (e.g., a transistor). For instance, switching times may be optimized by electrically connecting the resistive field structure to the source, such as in FIG. 2B-2C. As can be seen in FIG. 2B, the apparatus 2000 includes a field plate 2050 that is disposed between the gate 230 and the drain 220, yet electrically isolated from the gate 230 by a portion of the passivation layer 280. Instead, the field plate 2050 is electrically connected to the source 210 by any useful manner, such as an extended plate. The extended plate can have any useful configuration, such as shown in FIG. 2C. For instance, the apparatus 2100 can include an extended field plate 2150 that is electrically connected to the source 210 and the drain 220 but isolated from the gate 230 by a portion of the passivation layer 280.

The RFP can be formed from any useful conductive material. As described herein, in one embodiment, the RFP is formed of a material having a resistivity that is low enough to effectively modulate the electric field but that it is also high enough to limit the leakage current. In some embodiments, the RFP has a resistivity p of from about $10^6$ Ω·cm to about $10^8$ Ω·cm. Exemplary materials include, e.g., silicon carbide, boron carbide, titanium oxide, tungsten oxide, and/or molybdenum oxide, as well as doped forms and composites thereof.

As described herein, the highest electric field is generally observed near the drain-side of the gate. Thus, in order to provide an optimal, normalized electric field across the entire active layer of the device, one or more field-shaping structures can be employed. In some embodiments, the apparatus can further include a charge variation layer that locally reduces the polarization charge $\sigma_P$, thereby specifically addressing the electric field in proximity to the drain-side of the gate.

Figure 2D:
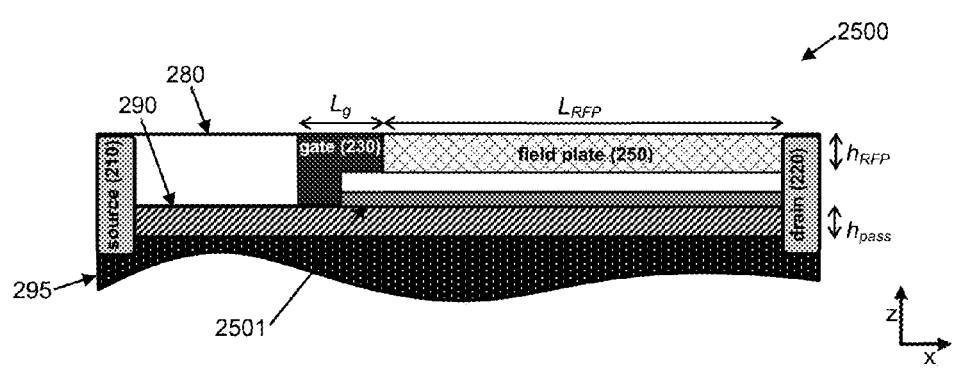

For instance, FIG. 2D shows an apparatus 2500 including a charge variation layer 2501 disposed between the gate 230 and the drain 220, as well as disposed beneath the field plate 250. The charge variation layer is, in essence, laterally varying the strain state of the underlying barrier layer 290, such that the piezoelectric polarization component changes along the channel region formed at the heterojunction between the barrier and buffer layers 290, 295. For instance, the charge variation layer can result in an increase in 2DEG density in the drift region from the gate towards the drain.

The charge variation layer can be used in combination with a resistive field plate or the resistive field cage. In addition, the charge variation layer can be formed from any useful material. For instance, this layer can includes a passivating film of varying thickness (e.g., where the thickness of the layer is measured along the z-direction in FIG. 2D, and this thickness is varied along the x-direction between the gate and drain) that is deposited on top of the barrier layer. In another instance, the charge variation layer can include a material having a plurality of varying size openings between the gate and the drain. Additional methods and materials regarding such charge variation layers are described in U.S. Pat. Pub. Nos. 2013-0313560, 2013-0313611, and 2013-0313612, each of which is incorporated herein by reference in its entirety.

The semiconductor device can include any number of useful structures. In FIG. 2A-2D, the semiconductor device is a HEMT having a passivation layer 280, a barrier layer 290, and a buffer layer 295. These layers can be composed of any useful material(s). Exemplary materials include any described herein, such as GaN (e.g., for the buffer layer), AlGaN (e.g., for the barrier layer), as well as SiN (e.g., $Si_3N_4$), $SiO_2$, or $Al_2O_3$ (e.g., for the passivation layer, which can include a passivation stack of any of these materials, as described herein). Additional features of the semiconductor device are described herein.

Resistive Materials

The resistive field structures herein can be composed of any useful material. Exemplary resistive materials include silicon carbide, titanium oxide, tungsten oxide, and/or molybdenum oxide, boron carbide, a ceramic, a p-type material, Si, AlGaN (e.g., p-type AlGaN with high Al mole fraction), TaN, TiN, etc. In particular embodiments, the resistive element comprises p-type AlGaN with a high Al mole fraction, where the low hole mobility allows for a high resistance even when the doping is significantly higher than that of silicon (see, e.g., Nakarmi M L et al., "Enhanced p-type conduction in GaN and AlGaN by Mg-δ-doping,"

*Appl. Phys. Lett.* 2003 May; 82(18):3041-3; and Li J et al., "Optical and electrical properties of Mg-doped p-type $Al_xGa_{1-x}N$," *Appl. Phys. Lett.* 2002 February; 80(7):1210-2). The advantages of high Al content AlGaN as a resistive element are higher breakdown voltage, and elimination of etching the epitaxial GaN to define the resistive element. In other embodiments, the resistive element includes titanium nitride (TiN), which is another material that can be deposited to achieve a large range of resistivities (depending on the Ti content). In yet another embodiment, the resistive element includes silicon carbide (SiC), which can be doped with oxygen to provide the desired resistivity.

Electrical Connections

The structures of the apparatus, device, and field structures herein can be electrically connected in any useful manner.

For the resistive field cage, a plurality of field cage taps is electrically coupled to a resistive element. As shown in FIG. 1A, electrical coupling is achieved by using a plurality of contacts 151-154. In addition to contacts, electrical coupling between the taps and resistive element can be attained with any useful structures. In one example, one or more vias and one or more interconnects can be used to electrically couple the taps with the resistive element. Other non-limiting structures include one or more wires, posts, etc.

As described herein, the resistive element is electrically coupled to the semiconductor device, e.g., the source, gate, and/or drain. Electrical coupling can be achieved by any useful structure, e.g., one or more vias and one or more interconnects, contacts (e.g., Schottky contacts), contact pads, wires, posts, etc.

Exemplary materials for electrical coupling include Si, Ti, Al, Mo, Ta, Ni, Au, as well as combinations thereof (e.g., Ti/Al/Ni/Au, Ni/Au/Ni alloys or stacks) and any ohmic metal (e.g., any described herein).

Exemplary methods for forming such structures include two-metal level technology with optional dielectric-assisted lift-off patterning, patterning, etching, metallization, thermal annealing, reactive ion etching, as well as methods are described in U.S. Pat. No. 6,566,258; Gosset L G et al., *IEEE Intl Interconnect Technol. Conference*, 4-6 Jun. 2007, pages 58-60; and Pownall R et al., *IEEE Photonics Technol. Lett.* 2007 April; 19(7):513-5, each of which is incorporated herein by reference in its entirety.

Semiconductor Devices

The field structure of the disclosure can be employed in combination with any useful semiconductor device. In general, the semiconductor device includes a buffer layer, a barrier layer, and a passivation layer, as well as various terminals or electrodes (e.g., the drain, source, and/or gate). These three layers operate together to form an HEMT. The buffer and barrier layers are generally formed from materials having a difference in bandgap and/or polarizability. This difference provides a heterojunction formed between the buffer and barrier layers, where two-dimensional electron gas (2DEG) accumulates at or near this heterojunction. Alternatively, a channel layer can be provided between the buffer and barrier layers, and 2DEG forms within the channel layer. The passivation layer is generally disposed above the barrier layer and serves to reduce charge trapping on this barrier layer. Other layers are optional (e.g., insulator layers, channel layers, capping layers, etc.).

To form a heterojunction, the buffer and barrier layers may be formed from a lower bandgap material and a high bandgap material, respectively, thereby allowing the high bandgap material to supply carriers to the lower bandgap material. In this manner, 2DEG accumulates at the channel region formed at this heterojunction. Alternatively, materials can be chosen to allow for formation of two-dimension hole gas (2DHG) at the heterojunction.

Figure 13A:
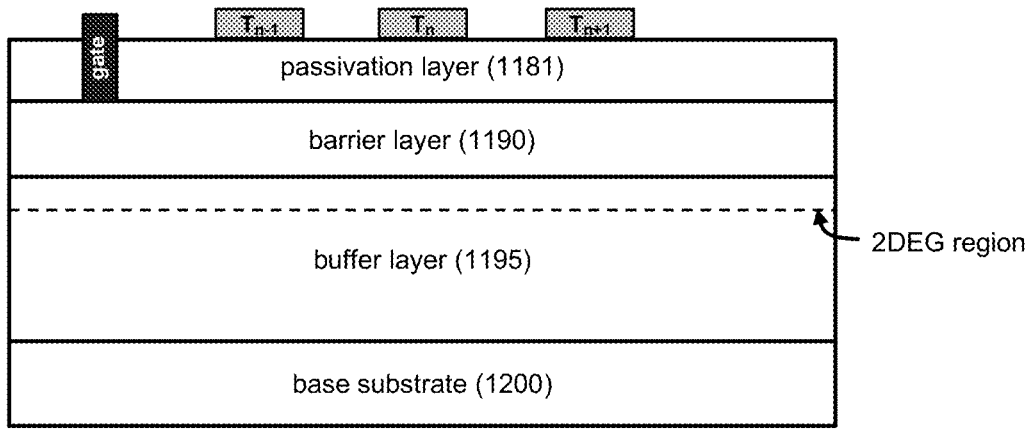
FIG. 13A-13G provides exemplary semiconductor devices having various functional layers.

Exemplary semiconductor devices are described in FIG. 13A-13G. In FIG. 13A, the device includes a base substrate 1200, a buffer layer 1195 configured to provide a 2DEG region (dashed line), a barrier layer 1190, and a passivation layer 1181. The base substrate can be formed from any useful material, e.g., Si, SiC, sapphire, GaN, or $Al_2O_3$.

Figure 13B:
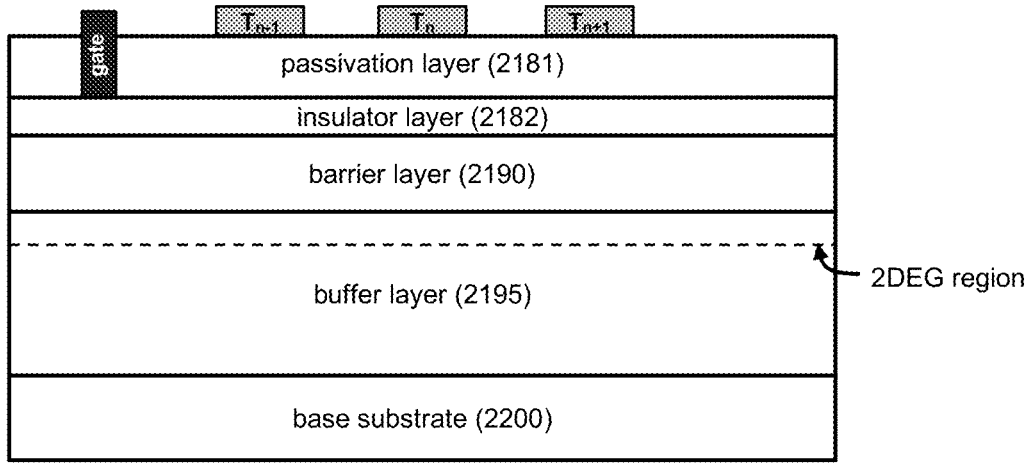
Figure 13C:
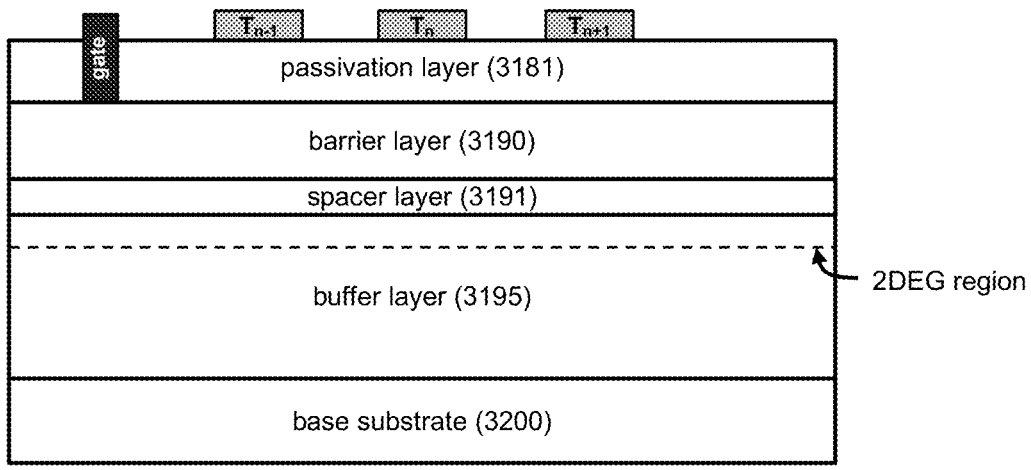

The semiconductor device can include any number of optional layers, such as an insulator layer or a spacer layer, provided in any useful position within the semiconductor stack. As shown in FIG. 13B, the device can include a base substrate 2200, a buffer layer 2195 configured to provide a 2DEG region (dashed line), a barrier layer 2190, an insulator layer 2182, and a passivation layer 2181. As shown in FIG. 13C, the device can include a base substrate 3200, a buffer layer 3195 configured to provide a 2DEG region (dashed line), a spacer layer 3191, a barrier layer 3190, and a passivation layer 3181.

Figure 13D:
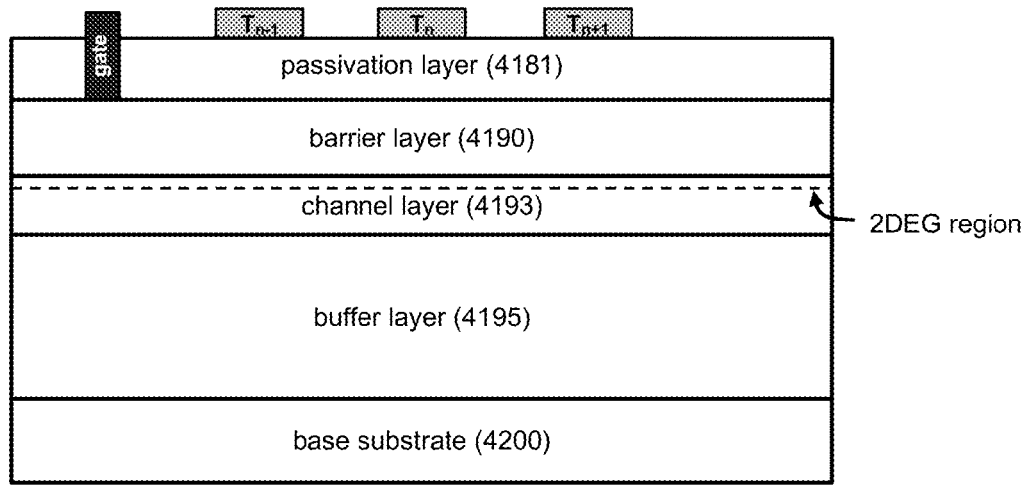
Figure 13E:
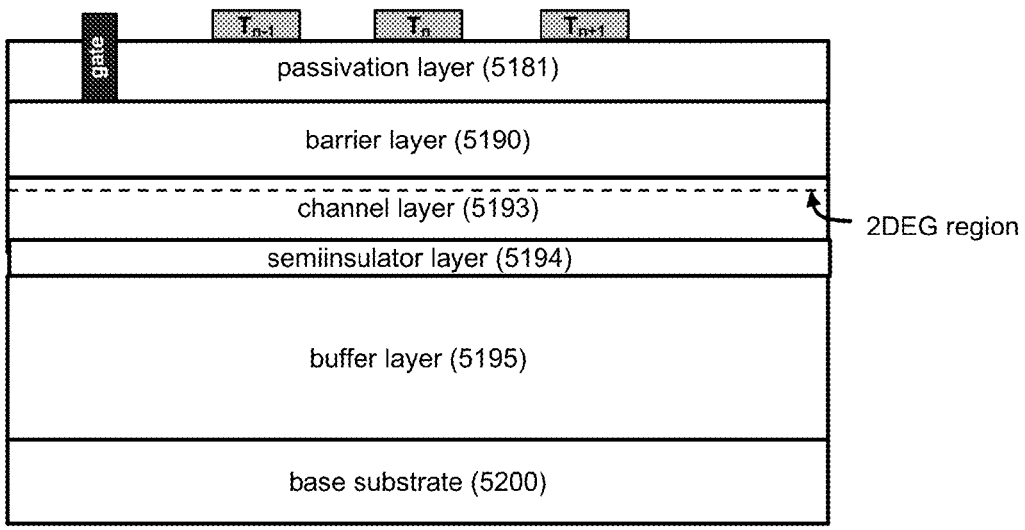

The semiconductor device can include one or more channel layers disposed between the buffer and barrier layers. As shown in FIG. 13D, the device can include a base substrate 4200, a buffer layer 4195, a channel layer 4193 configured to provide a 2DEG region (dashed line), a barrier layer 4190, and a passivation layer 4181. This device can also include any number of other useful layers. As shown in FIG. 13E, the device can include a base substrate 5200, a buffer layer 5195, a semiinsulator layer 5194, a channel layer 5193 configured to provide a 2DEG region (dashed line), a barrier layer 5190, and a passivation layer 5181. The channel layer can include any useful material, such as any described for the buffer layer, as well as doped or undoped GaN or InGaN. Additional channel layers are described in U.S. Pat. No. 7,851,284, which is incorporated herein by reference in its entirety.

FIG. 13A-13E provide the resistive element to be field cage taps ($T_{n-1}$, $T_n$, and $T_{n+1}$), but these elements can also be replaced with a resistive field plate (e.g., $T_n$, or any herein).

Figure 13F:
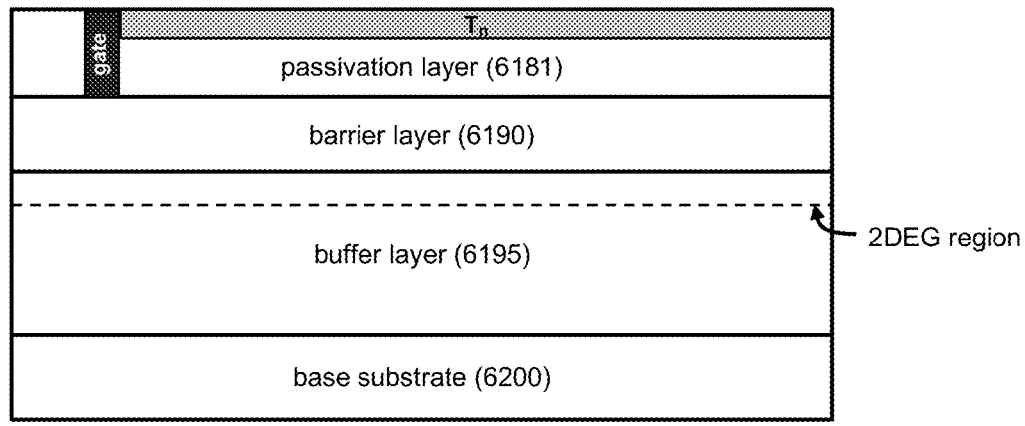
Figure 13G:
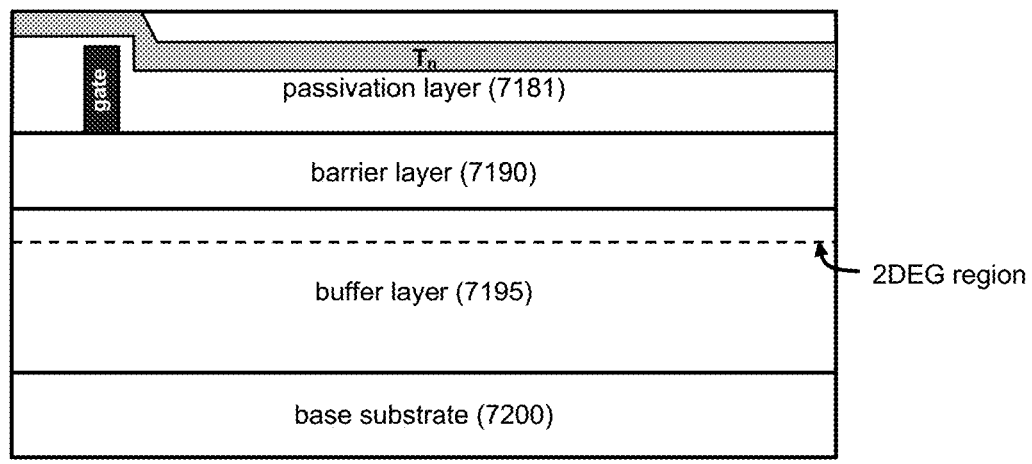

In addition, the resistive elements (e.g., the field cage taps or resistive field plate) can be disposed in any useful manner on or within a layer of the semiconductor device. For instance, as shown in FIG. 13F, the resistive element $T_n$ is disposed on top of the passivation layer 6181, which in turn is disposed on top of the barrier layer 6190, buffer layer 6195, and base substrate 6200. As also shown in FIG. 13G, the resistive element $T_n$ is disposed within the passivation layer 7181, which in turn is disposed on top of the barrier layer 7190, buffer layer 7195, and base substrate 67200.

In some embodiments, the barrier and buffer layers are chosen to ensure that the materials for these layers have different bandgap energies. The barrier and buffer layers can each be formed from a single layer of material or from a stack of materials (e.g., a stack of two layers, a stack of alternating layers, or a stack of a plurality of alternating layers).

In general, the barrier layer includes a wide bandgap material, e.g., AlGaN (e.g., $Al_xGa_{1-x}N$, such as $Al_{0.15}Ga_{0.85}N$, $Al_{0.23}Ga_{0.77}N$, or $Al_{0.26}Ga_{0.74}N$, or where $0.1 \leq x \leq 0.5$), InGaN (e.g., $In_xGa_{1-x}N$, where $0 \leq x \leq 1$), InGaP (e.g., $In_{1-x}Ga_xP$, such as $In_{0.5}Ga_{0.5}P$), AlGaAs (e.g., $Al_xGa_{1-x}As$, such as $Al_{0.3}Ga_{0.7}As$), AlN, AlInN, InGaAlN (e.g., $In_yGa_zAl_{1-y-z}N$, where $0 \leq y,z \leq 1$ or $0.03 \leq y \leq 0.3$ and $0.01 \leq z \leq 0.1$), including n-type or n-doped wide bandgap materials. In some embodiments, the barrier layer includes a Group III-V ternary semiconductor, e.g., AlGaN or InGaN.

The barrier layer can be any useful height such as from about 10 nm to about 50 nm (e.g., from about 25 to about 50 nm). In particular embodiments, the barrier layer includes low Al percentage (e.g., about 25% Al in AlGaN) to reduce 2DEG density. In some embodiments, the buffer layer can include doping (e.g., carbon, iron, and/or magnesium doping).

The buffer layer generally includes a narrower bandgap material (e.g., as compared to the barrier layer). Exemplary materials include a Group III nitride semiconductor material, e.g., GaN, GaAs, InN, InP, and InGaN (e.g., $Al_xIn_yGa_{1-x-y}N$, where $0 \leq x \leq 1$, $0 \leq y \leq 1$, $0 \leq x+y \leq 1$, or $In_xGa_{1-x}N$, where $0 \leq x \leq 1$), where the aluminum content can be in the range of about 0 atomic % to about 30 atomic %. In some embodiments, the buffer layer includes a Group III-V binary semiconductor, e.g., GaN, GaAs, or InP. The buffer layer can include a single layer of a material. Alternatively, the buffer layer can include a composite film having a plurality of layers, such as a plurality of alternating GaN and AlN layers. Optionally, the buffer layer can be doped (e.g., with C or Fe). The buffer layer can have any useful structural dimensions, such as a height of about 0.3-10.0 μm, e.g., from about 1 to about 4 μm.

Exemplary barrier and buffer layer combinations include an AlGaN barrier layer and a GaN buffer layer, having bandgaps of about 4.2 eV and about 3.4 eV, respectively; an AlGaAs barrier layer and a GaAs buffer layer; an AlInP barrier layer and an InP buffer layer; and an InAlN barrier layer and a GaN buffer layer, optionally having a spacer layer therebetween.

Figure 4A:
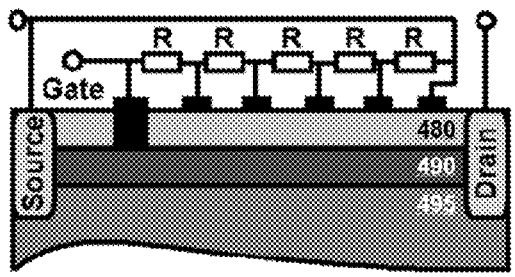
FIG. 4A-4B shows exemplary schematics for FIG. 4A which is a gate field cage and FIG. 4B which is a drain field cage using a resistive voltage divider having resistive elements R. Taps connect the resistive voltage divider to the passivation surface. Also shown are the buffer layers 495, 595, barrier layers 490, 590, and passivation layers 480, 580.

The passivation layer can include one or more layers. For example, the passivation layer can include a passivation stack, such as a stack including a $SiO_2$ layer and an $Al_2O_3$ layer (e.g., $SiO_2$-$Al_2O_3$ layers 181, 182 in FIG. 1A) or a stack including $Al_2O_3$—$SiO_2$-$Al_2O_3$ layers; or include a single layer (e.g., layer 480 in FIG. 4A). Exemplary components for the passivation layer includes, silicon oxide (e.g., $SiO_2$), silicon nitride (e.g., $Si_3N_4$ and $SiN_x$), silicon oxynitride (e.g., SiON), aluminum oxide (e.g., $Al_2O_3$), aluminum nitride (e.g., $AlN_x$), zinc oxide, zirconium oxide, hafnium oxide, titanium oxide, carbon-doped silicon oxide, carbon-doped silicon nitride, or carbon-doped silicon oxynitride. Exemplary thickness $h_{pass}$ include about 300 to about 700 nm (e.g., about 500 nm). Methods for making such layers include atomic layer deposition (ALD), chemical vapor deposition, as well as those described in U.S. Pub. No. 2013-0134435.

The semiconductor device can have any number of other optional layers, such as a depletion layer (e.g., disposed on top of the barrier layer and including, e.g., a p-type material, GaN, InN, AlGaN, AlInN, InGaN, AlInGaN, NiO, $NiO_2$, ZnO, or $ZnO_2$), an insulator layer (e.g., disposed between the passivation and barrier layers), a capping layer (e.g., disposed on between the passivation and barrier layers), a spacer layer (e.g., between the barrier and buffer layers), a channel layer, a transition layer (e.g., between the buffer layer and the base substrate and including, e.g., GaN, AlGaN, or AlN), a nucleation layer (e.g., above the base substrate to promote growth or deposition of the buffer layer and including, e.g., AlN or AlGaN), a gate oxide layer (e.g., disposed beneath the gate and/or within the passivation layer, where the gate oxide layer can include any useful oxide, such as aluminum oxide) etc.

In some embodiments, the insulator layer can be configured to reduce gate leakage current and to improve gate integrity. Exemplary materials for the insulator layer include $Al_2O_3$, $HfO_2$, $SiO_2$, $Si_3N_4$, as well as any provided for the passivation layer.

Exemplary capping layers can include GaN (e.g., undoped GaN or n-type GaN (n-GaN)), AlN, SiN, as well as combinations thereof (e.g., capping layers including a n-GaN—AlN-n-GaN stack from top to bottom; or including a SiN-n-GaN stack).

Exemplary spacer layers include an AlN layer optionally having a delta-doped layer formed preferably by depositing one monolayer of Si atoms on the AlN spacer layer. In some embodiments, the space layer includes $Al_xGa_{1-x}N$ with an Al content preferably in the range of $0.1 \leq x \leq 0.4$, or $In_yAl_{1-y}N$ with an In content preferably in the range of $0.17 \leq y \leq 0.29$). In some embodiments, the spacer layer has a thickness between about 5 and 30 Å. Additional spacer layers are described in U.S. Pat. Pub. Nos. 2013-0256681 and 2013-0334538, each of which is incorporated herein in its entirety.

The drain, source, and gate for the semiconductor device can have any useful geometry. In addition, any useful ohmic metal(s) can be used to form the drain, source, and/or gate, e.g., Ti, Al, Ni, Ir, Pt, Au, Mo, Au, Co, a p-metal (e.g., Ni, Ir, Pt, and/or Au), a nitride (e.g., TiN, TaN, and/or ZrN), as well as alloys thereof (e.g., Ti/Al/Ni or Ni/Pt/Au). In some embodiments, the gate electrode layer includes a refractory metal, e.g., titanium (Ti), titanium nitride (TiN), titanium tungsten (TiW), titanium tungsten nitride (TiWN), tungsten (W) or tungsten nitride (WN). Gate electrodes are generally formed by forming a recess in the passivation layer and then depositing ohmic metal metallization.

Exemplary methods of making layers and electrodes for semiconductor devices are described in U.S. Pat. Nos. 7,851,284, 7,859,021, 8,269,253, 8,344,420, 8,502,272, 8,519,442, 8,536,623, 8,569,769, 8,624,296, 8,624,667, and RE44538, as well as U.S. Pub. Nos. 2012-0274402, 2013-0134435, 2013-0175539, 2013-0256679, 2013-0256681, 2013-0264580, 2013-0334538, and 2013-0341635, each of which is incorporated herein by reference in its entirety.

One or more structural features or dimensions of the semiconductor device can be optimized for use in combination with a resistive field structure. Exemplary dimensions include height of the passivation layer $h_{pass}$ and gate length $L_g$.

Uses

The resistive field structure of the disclosure can be used with any semiconductor device that would benefit from having a uniform electric field distribution. In particular, the resistive field structure can be used with a semiconductor device configured as a power switching device (e.g., for high voltage applications) or as an amplifier (e.g., a power amplifier).

Exemplary semiconductor devices include field effect devices, such as a field effect transistor (FET), including a high electron mobility transistor (HEMT), a junction field-effect transistor (JFET), a metal-oxide-semiconductor field-effect transistor (MOSFET, e.g., an SiC MOSFET), a dual-gate MOSFET (DGMOSFET), a depleted p-channel (DEPFET), a fast-reverse or fast-recovery epitaxial diode FET (FREDFET), a heterostructure insulated gate field-effect transistor (HIGFET), a modulation-doped field-effect transistor (MODFET), a tunnel field-effect transistor (TFET), an insulated-gate bipolar transistor (IGBT), a metal-semiconductor field-effect transistor (MESFET), or a quantum field effect transistor (QFET); or junction-based charge control devices, such as a diode, a triple junction device (e.g., a thyristor having an anode, cathode, and gate), a bipolar junction transistor, etc.

Methods of Making Resistive Field Structures and Apparatuses Including Such Structures Exemplary methods for making semiconductor devices and apparatuses include MESA etching; ion implantation; deposition, including chemical vapor deposition (CVD), inductively coupled plasma chemical vapor deposition, metal organic chemical vapor deposition (MOCVD), organometallic chemical vapor deposition (OMCVD), magnetron sputtering, organometallic vapor phase epitaxy (OMVPE), molecular beam epitaxy (MBE), atomic layer epitaxy (ALE), chemical beam epitaxy (CBE), low-temperature (LT) atomic layer deposition (ALD) method, metal-organic chemical vapor deposition (MOCVD), and hydride vapor phase epitaxy (HVPE); annealing; as well as any method described in Asano T et al., "Breakdown characteristics in AlGaN/GaN HEMTs with multi-field-plate structure," *IEEE Intl Meeting for Future of Electron Devices*, held in Kansai, Japan on 9-11 May 2012, 2 pages; Lee J G et al., "Field plated AlGaN/GaN-on-Si HEMTs for high voltage switching applications," *J. Korean Phys. Soc.* 2011 September; 59(3):2297-300; Chiang C Y et al., "Effect of field plate on the RF performance of AlGaN/GaN HEMT devices," *Physics Procedia* 2012; 25:86-91; Cho K H et al., "Design of AlGaN/GaN HEMTs employing mesa field plate for breakdown voltage enhancement," *Solid-State Electron.* 2010; 54:405-9; and U.S. Pat. No. 6,316,793, each of which is incorporated herein by reference in its entirety

EXAMPLES

Example 1: A Distributed Impedance "Field Cage" for Improved Breakdown Voltage Scalability in AlGaN/GaN HEMTs We present the concept as well as design considerations for a distributed impedance "field cage" that greatly improves the uniformity of the electric field distribution in a lateral HEMT. A resistive voltage divider was used to control the electric field throughout the access region. Unlike conventional designs, the electric field was more uniform at high voltage than at low voltage, making the structure a very promising one for achieving breakdown voltage scalability and improving the unipolar Figure of Merit for the lateral AlGaN/GaN power HEMT. Through optimization of parasitic capacitance, the "field cage" was shown to achieve excellent electric field control from dV/dt=0 (i.e., DC) to 100 V/ns. The superior control of electric field was also shown to result in reduced switching loss.

AlGaN/GaN High Electron Mobility Transistors (HEMTs) have recently seen widespread progress as a key device for the next generation of high-voltage power electronics (see, e.g., B Lu et al., "High breakdown (>1500 V) AlGaN/GAN HEMTs by substrate-transfer technology," *IEEE Electron Device Lett.* 2010 September; 31(9):951-3; Tipirneni N et al., "The 1.6-kV AlGaN/GaN HFETs," *IEEE Electron Device Lett.* 2006 September; 27(9):716-8; Das J et al., "A 96% efficient high-frequency DC-DC converter Using E-Mode GaN DHFETs on Si," *IEEE Electron Device Lett.* 2011 October; 32(10):1370-2; and Wu Y et al., "A 97.8% efficient GaN HEMT boost converter with 300-W output power at 1 MHz," *IEEE Electron Device Lett.* 2008 August; 29(8):824-6). The ease of achieving a low on-state resistance due to high channel mobility ($\mu_{ch}$), high breakdown field due to the wide bandgap of GaN ($E_g$=3.4 eV), and the majority-carrier operation of the AlGaN/GaN HEMT has made it one of the most promising devices for enhancing switching speeds at high voltage, high power dissipation, and high temperature operation.

In spite of impressive progress, the unipolar Figure of Merit for state-of-the-art commercial HEMTs ($V_{br}^2/R_{on}$) (Zhang N Q et al., "Kilovolt AlGaN/GaN HEMTs as switching devices," *Phys. Stat. Solid A* 2001; 188(1):213-7) continues to be well below values predicted by the Baliga Figure of Merit (BFOM) (Baliga B J, "Semiconductors for high-voltage, vertical channel field effect transistors," *J. Appl. Phys.* 1982 March; 53(3):1759-64). Theoretically, the wide band-gaps of GaN and AlGaN should enable the high-frequency switching capability of unipolar field effect transistors to be extended to a voltage that is higher by an order of magnitude compared to Si-based devices, which is an unattained goal as of now.

The problem of breakdown voltage scaling in AlGaN/GaN HEMTs is strongly related to the non-uniform OFF-state electric field distribution in the HEMT, where much of the voltage drop occurs near the drain side edge of the gate electrode. This voltage drop produces an electric field that exceeds the critical field for AlGaN or GaN (or the electric field necessary for punch-through) at a much lower value than the breakdown voltage predicted by assuming a uniform electric field across the entire region from gate to drain edge. Even for electric fields less than $E_{crit,GaN}$ or $E_{crit,AlGaN}$ (critical electric fields for GaN or AlGaN; this is approximately 3 MV/cm for GaN), a HEMT can suffer breakdown due to impact ionization in the low $E_{crit}$ Si substrate (this substrate is necessary for commercial viability of GaN as a power switching technology).

While use of appropriate passivation and encapsulation improves breakdown voltage by eliminating surface flashover, the fundamental problem of voltage scalability due to the non-uniform field distribution is evidenced by studies which show no further increase in breakdown voltage with increasing gate-to-drain spacing ($L_{gd}$) after a certain $L_{gd}$, even in a Fluorinert™ ambient (see B Lu et al., "High breakdown (>1500 V) AlGaN/GAN HEMTs by substrate-transfer technology," *IEEE Electron Device Lett.* 2010 September; 31(9):951-3). Si-based power devices rely on precisely doped p-n junctions to achieve electric field control. The difficulty of achieving lightly doped p-n junctions with precise control in GaN has resulted in the field plate being a more commonly used option for breakdown voltage enhancement (Wu Y F et al., "30-W/mm GaN HEMTs by field plate optimization," *IEEE Electron Device Lett.* 2004 March; 25(3):117-9; Xing H et al., "High breakdown voltage AlGaN—GaN HEMTs achieved by multiple field plates," *IEEE Electron Device Lett.* 2004 April; 25(4):161-3; Karmalkar S et al., "Very high voltage AlGaN/GaN high electron mobility transistors using a field plate deposited on a stepped insulator," *Solid-State Electron.* 2001; 45:1645-52; Dora Y et al., "High breakdown voltage achieved on AlGaN/GaN HEMTs with integrated slant field plates," *IEEE Electron Device Lett.*, 2006 September; 27(9):713-5; and Karmalkar S et al., "Field-plate engineering for HFETs," *IEEE Trans. Electron Devices* 2005 December; 52(12):2534-40).

Here, we present the concept and design considerations for a distributed impedance "field cage" that greatly improves the uniformity of the electric field distribution in a lateral HEMT. A resistive voltage divider was used to control the electric field throughout the access region. The electric field was more uniform at high voltage than at low voltage, making the structure a very promising one for achieving voltage scalability in the lateral AlGaN/GaN HEMT. Through optimization of parasitic capacitance, the field cage was shown to achieve excellent electric field control from dV/dt=0 (i.e., DC) to 100 V/ns. The superior control of the electric field was also shown to result in the added benefit of reduced switching loss.

The simulated structures have 20 nm thick $Al_{0.25}Ga_{0.75}N$ barriers and a 2DEG density of $6\times10^{12}$ cm$^{-2}$. For the AlGaN surface, a negative fixed charge of $-3.2\times10^{13}$ cm$^{-2}$ and a surface donor trap density of $3\times10^{13}$ cm$^{-2}$ was assumed. A doping $N_D=10^{14}$ cm$^{-3}$ was assumed in GaN for the 200 nm closest to the AlGaN (i.e. the channel region). In the GaN buffer, a deep acceptor doping of $N_A=5\times10^{16}$ cm$^{-3}$ ($E_a=0.25$ eV) was assumed, since C or Fe doping is often employed to achieve low-conductivity buffers in GaN HEMTs for high-voltage applications.

The devices employed $Si_3N_4$ passivation. The thickness of the passivation layer ($h_{pass}$), varied with the field control structure employed, and details are given as the different structures are described. The gate length $L_g=2$ μm. Dimensions of the different field-control structures are also described in detail as we describe the different structures. Simulations were performed using Synopsys Sentaurus Device.

Both gate and source field plates have been used with some success in enhancing breakdown voltage for AlGaN/GaN HEMTs. The benefits of the field plate can be maximized using multiple optimized field plates (Karmalkar S et al., "Very high voltage AlGaN/GaN high electron mobility transistors using a field plate deposited on a stepped insulator," *Solid-State Electron.* 2001; 45:1645-52) or slant field plates (Dora Y et al., "High breakdown voltage achieved on AlGaN/GaN HEMTs with integrated slant field plates," *IEEE Electron Device Lett.,* 2006 September; 27(9):713-5).

Figure 3A:
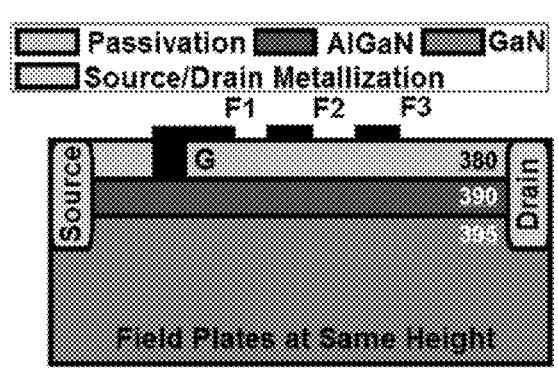
FIG. 3A-3D shows exemplary AlGaN/GaN HEMTs with three field plates. Shown are FIG. 3A which is an illustration of field plates at the same height from the AlGaN barrier surface 390 and FIG. 3B which is an illustration of field plates at different heights from the AlGaN barrier surface 390. The field plates are labeled "F1," "F2," and "F3," and the gate is labeled "G." Also shown are the buffer layers 395 and passivation layers 380-382. $h_{pass}$=100 nm in FIG. 3A and is the same as the vertical spacing between field plates in FIG. 3B. Field plate length=0.5 μm for FIG. 3A and plate F1 in FIG. 3B. For FIG. 3B, the spacing between successive field plate edges was 0.5 μm.
Figure 3B:
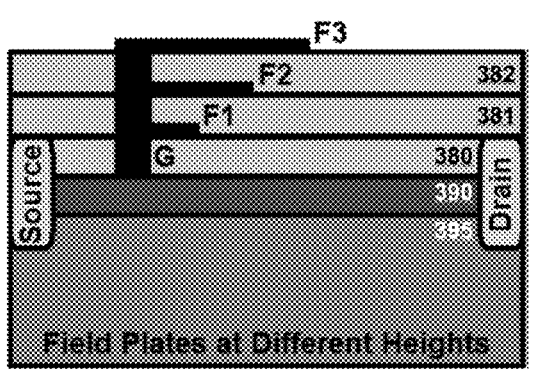
Figure 3C:
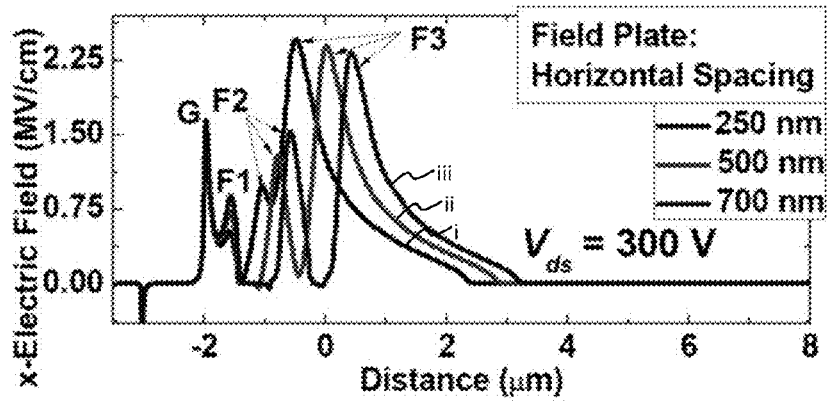

FIG. 3A-3D demonstrates the scalability issues associated with field control through structural variation. For field plates at the same height (F1, F2, and F3 in FIG. 3A), there is an electric field peak next to each field plate (FIG. 3C). However, the electric field peak next to the field plate closest to the drain is the highest one, and the field peaks progressively become smaller closer to the gate. Increasing the field plate spacing makes the field sharing less efficient, since the electric field goes to zero under the field plates. On the other hand, reducing the spacing reduces the electric field peaks associated with the field plates near the gate.

A more uniform electric field distribution can be achieved in a structure where multiple field plates are at different heights from the AlGaN surface (F1, F2, and F3 in FIG. 3B). However, as the vertical spacing between field plates is increased, reduced capacitance between the field plate and the semiconductor surface makes it more difficult to achieve field control. Therefore, all field plates have to be accommodated within a small height from the AlGaN surface (~450 nm in FIG. 3D). Beyond this height, the field peak next to the plate highest from the AlGaN surface and closest to the drain decreases, and the field distribution approaches the 2 field plate case. Achieving a high number of field plates within a short height with good uniformity over a large area is challenging and entails prohibitively complicated fabrication.

While a sloped field plate has been demonstrated to be successful (Dora Y et al., "High breakdown voltage achieved on AlGaN/GaN HEMTs with integrated slant field plates," *IEEE Electron Device Lett.,* 2006 September; 27(9): 713-5), it is only for short lengths and cannot be implemented as a structure that slopes uniformly over ~50 μm, which is necessary to achieve large breakdown voltage.

It is also worthwhile to note that although many of the optimized structures present impressive breakdown voltage $V_{br}$ and unipolar Figure of Merit numbers, the breakdown criterion often chosen is not representative of a power device with high current carrying capability. For example, to provide an ON-current between 10 and 100 A, the device width required is between 0.05 and 0.5 m, assuming $I_d=200$ mA/mm. An OFF-state $I_d$ of 0.1 mA/mm or higher (defined as the current at breakdown in many papers) implies 5 to 50 mA of OFF-state current for the device, which introduces significant problems with both input power and complexity of gate drive circuitry.

Figure 4B:
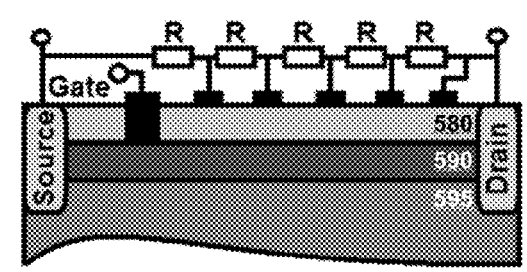

Here, we propose the use of a varying voltage, instead of varying structural features, to emulate the functionality of the vertically spaced field plates in FIG. 3B or the sloped field plate. A highly resistive element is used between the source and gate in a gate field cage (FIG. 4A) or between the source and drain in a drain field cage (FIG. 4B). Field taps at regular intervals are used to specify a gradually varying voltage boundary condition at the top surface of the passivation layer throughout the access region. Methods for realizing a structure like this are described herein. As used herein, the field cage employs a multi-contact voltage-distributed field control scheme.

Figure 5:
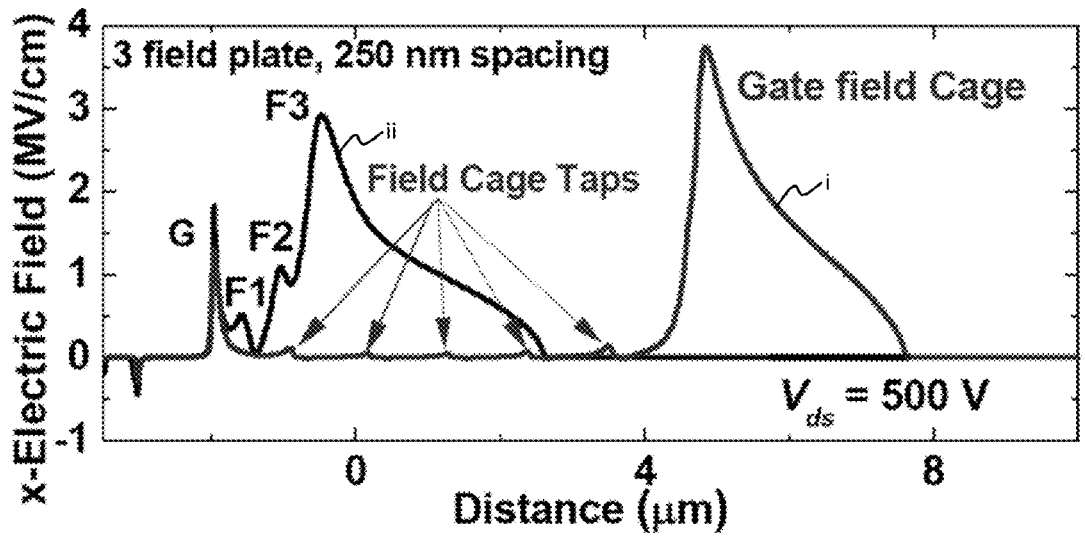
FIG. 5 shows an electric field profile for a gate field cage. Shown is an electric field profile from source to drain for $V_{ds}$=500 V (DC) for the structure with a gate field cage (labeled "i"). For reference, also shown is the electric field profile for a structure with 3 field plates spaced horizontally by 250 nm (labeled "ii" in FIG. 5 with peaks corresponding to gate "G" and field plates "F1," "F2," and "F3"), where this profile is identical to the black curve labeled "i" in FIG. 3C. Tap pitch (distance between centers of field cage taps)=1 μm. Distance between edges of consecutive taps ($d_{tap}$)=400 nm.

Under the conditions described herein, FIG. 5 shows that the gate field cage is not successful in effectively distributing the electric field. This is because $V_{gs}$ is small (~−5 V in the OFF-state), and a small voltage on the taps prevents any significant electric field buildup in the region from the gate edge to the field cage taps, resulting in a large field peak near the drain.

Figure 6:
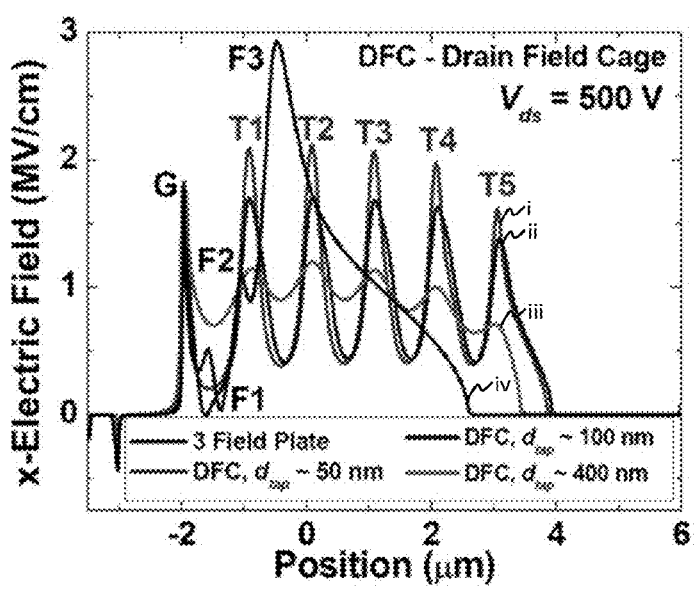
FIG. 6 shows electric field profiles for a drain field cage ("DFC"). Shown are electric field profiles from source to drain for $V_{ds}$=500 V (DC) for DFC structures having three differently-spaced drain field cages. Profiles are shown for DFC structures including a distance between edges of consecutive taps ($d_{tap}$) of 50 nm (labeled "i"), 100 nm (labeled "ii"), and 400 nm (labeled "iii"). Peaks in DFC data are labeled for taps 1 to 5 ("T1" to "T5"). For reference, also shown is the electric field profile for a structure with 3 field plates spaced horizontally by 250 nm (labeled "iv" in FIG. 6 with peaks corresponding to gate "G" and field plates "F1," "F2," and "F3"), where this profile is identical to the black curve labeled "i" in FIG. 3C. Tap pitch (distance between center of field taps)=1 μm. $h_{pass}$=100 nm for all structures. Resistance between consecutive taps R=1 GΩ.

The drain field cage (FIG. 4B) was successful in achieving greatly improved electric field uniformity and much smaller peak electric field (FIG. 6). In FIG. 6, the simulated structures had five field cage taps (labeled T1 to T5), and the resistance between consecutive taps was 1 GΩ. The large value of resistance was necessary, since a small resistance would result in excessive power dissipation in the field cage resistors due to the large OFF-state blocking voltage.

The tap pitch (distance between centers of two consecutive taps) was 1 μm for all cases. By making the taps thinner, the distance between the edges of 2 taps ($d_{tap}$) is increased. Thus, a smaller $d_{tap}$ corresponds to a thicker tap (i.e., increased $L_{tap}$ as shown in FIG. 1B). For instance, when tap pitch is maintained at 1 μm, a $d_{tap}$ of 400 nm provides a tap having length $L_{tap}$ of 600 nm. At that same tap pitch, decreasing $d_{tap}$ to 100 nm provides a tap having an increased $L_{tap}$ of 900 nm.

In these exemplary structures, the first tap is kept at a constant distance (1 μm) from the gate edge for all cases. As $d_{tap}$ is increased from 50 nm to 400 nm in FIG. 6, the electric field peak associated with taps T1 through T5 are greatly reduced and a very uniform electric field distribution is achieved. Although the peak associated with the gate remains invariant because of the fixed distance between the edge of the gate and T1, this field peak did not increase in magnitude with increasing $V_{ds}$ beyond ~50 V. While the drain field cage with thinner taps (and hence larger $d_{tap}$) was very successful in distributing the field under DC bias, its operation at a high frequency (i.e., high dV/dt) is more important for a power switching device.

FIG. 7A-7D shows the comparison between electric field control for devices with $d_{tap}=100$ nm (thicker tap) and $d_{tap}=400$ nm (thinner tap). The drain voltage is ramped from 0 to 500 V over a period of 5 ns, resulting in dV/dt=100 V/ns. As a measure of uniformity of the electric field distribution, the voltage difference between consecutive field cage taps (FIG. 7A) as a fraction of the total $V_{ds}$ is plotted in FIG. 7B. Both tap thicknesses show that the tap voltage distribution was initially non-uniform, but becomes more uniform as the voltage ramp proceeds, converging on the dashed black line at $(V_n-V_{n+1})/V_{ds}=0.2$ for a 5 tap structure, corresponding to the exact same voltage difference between all consecutive taps. The improvement in the tap voltage and hence the electric field uniformity at high voltage makes the field cage scheme a promising one for achieving breakdown voltage scalability.

Contrary to the DC behavior, the thin taps at high dV/dt show a much higher tap voltage at the tap nearest to the gate, and an electric field (FIG. 7C) that well exceeds the published $E_{crit,GaN}$. This might suggest that having thicker taps is a better option (since it keeps the field below the critical value for both DC (FIG. 6) and high dV/dt (FIG. 7C). However, this is not the case for two reasons. First, the electric field was still fairly spiked at the taps (close to $E_{crit,GaN}$). Second, and more importantly, thick taps led to an extremely high electric field in the device passivation that puts the passivation at risk of dielectric breakdown. FIG. 7D plots the electric field at the surface of the passivation between consecutive taps for the $d_{tap}$=100 nm case. Clearly, the electric field of ~10 MV/cm can cause severe concerns for the reliability of the dielectric and in the worst case lead to dielectric breakdown. Therefore, for the field cage to work at high dV/dt, it is necessary to improve the field distribution while using thin taps to maintain large enough $d_{tap}$.

Figure 7A:
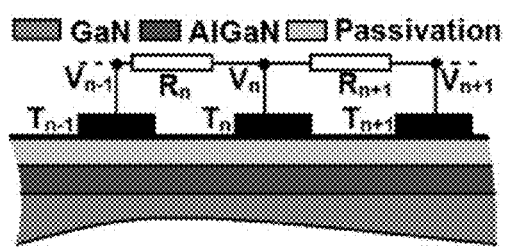
FIG. 7A-7D shows the effect of $d_{tap}$ on electric field profiles.
Figure 7B:
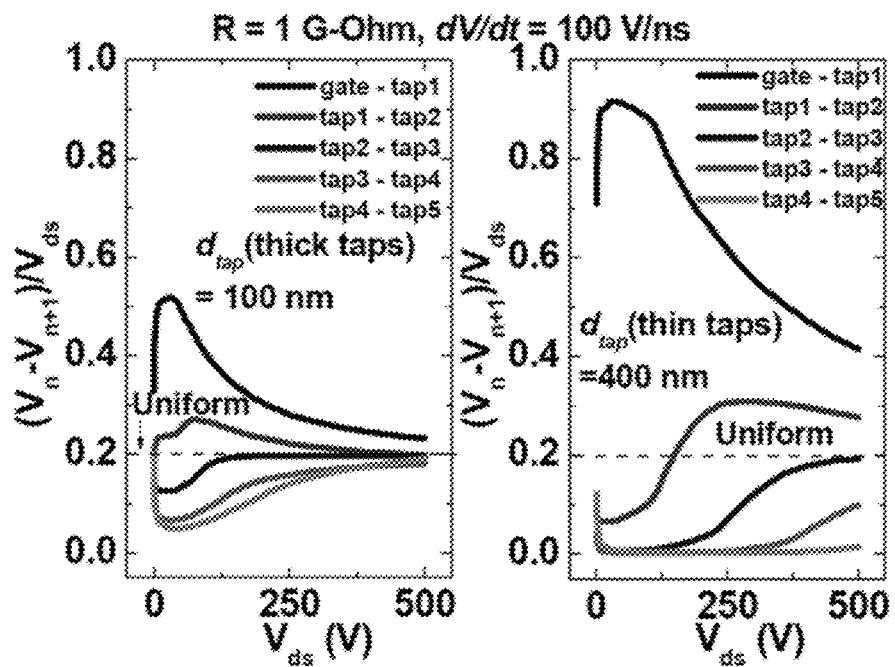
Figure 7C:
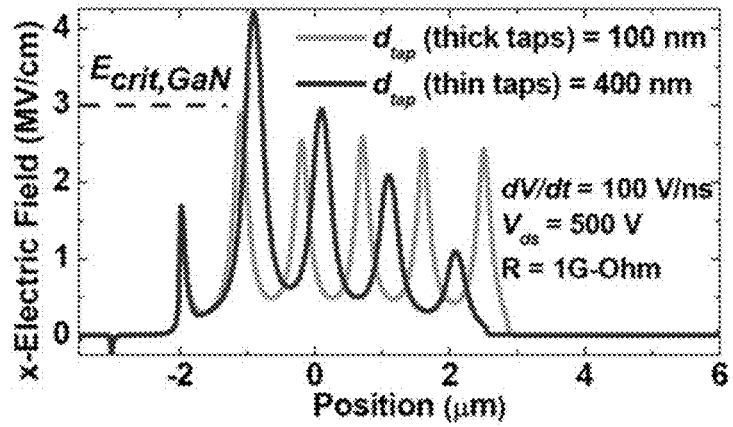
Figure 7D:
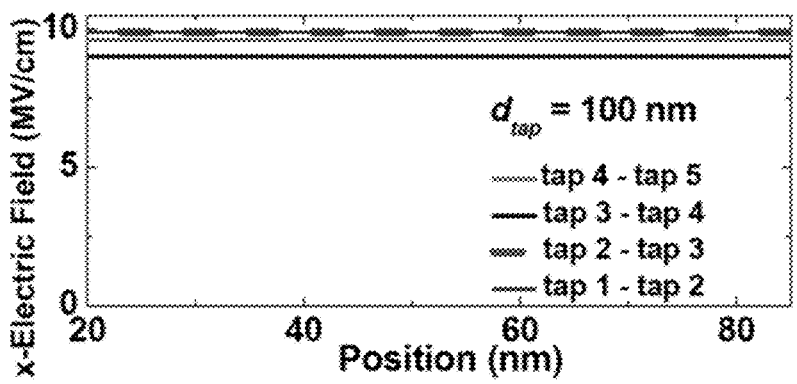

The results shown in FIG. 7B-7D are key in understanding the operation of the field cage and optimizing it for high-frequency operation. In DC operation, both thin and thick tap devices show an almost perfect tap voltage distribution throughout the range of voltages from 0 to 500 V. This indicates that a uniform electric field distribution is favored using thinner taps in the absence of displacement currents. Introduction of displacement currents in the structure makes the tap voltage distribution highly unequal (FIG. 7B). The non-uniform tap voltage distribution for the thin tap ($d_{tap}$=400 nm) device can be understood by considering the parasitic capacitances in the structure.

Figure 8:
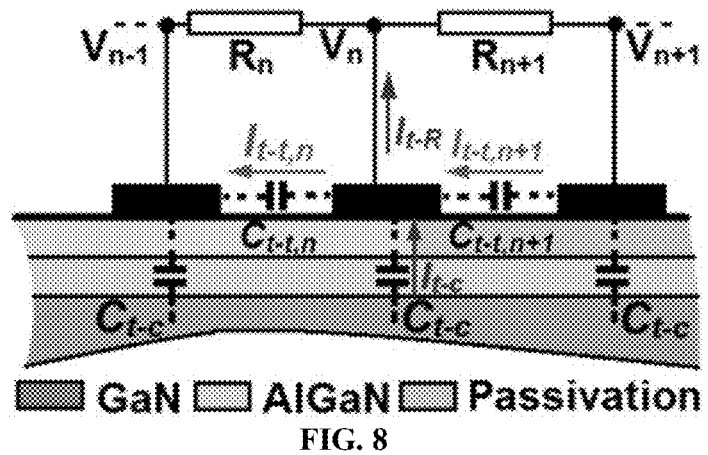
FIG. 8 is a schematic showing displacement current, voltage, resistance, and capacitance components for three consecutive field cage taps. Provided are voltages $V_{n-1}$, $V_n$, and $V_{n+1}$ associated with each of the three taps; displacement current components between taps ($I_{t-t,n}$ and $I_{t-t,n+1}$) and between the tap and the resistive element ($I_{t-R}$); resistance $R_n$ and $R_{n+1}$ associated with resistive elements $R_n$ and $R_{n+1}$, respectively; as well as the parasitic capacitances between taps ($C_{t-t,n}$ and $C_{t-t,n+1}$) and between the tap and the channel ($C_{t-c}$).

FIG. 8 shows the displacement current components at a given tap $T_n$. Since taps are equally spaced and cage resistances are equal, $I_{t-t,n}$ and $I_{t-t,n+1}$ are roughly equal in the absence of significant $I_{t-c}$. However, if the tap-to-channel capacitance $C_{t-c}$ is large enough to make $I_{t-c}$ significant compared to $I_{t-t,n}$, then the current $I_{t-c}$ distributes itself between the parallel impedances of $C_{t-t,n}$ (tap-to-tap capacitance) and resistance $R_n$ for resistive element $R_n$. At high frequency and high cage resistance, the impedance of $C_{t-t,n}$ decreases to a much lower value than $R_n$, and most of the current $I_{t-c}$ flows through $C_{t-t,n}$ making $I_{t-t,n}$ and $I_{t-t,n+1}$ unequal. Consequently, $V_n-V_{n-1}$ and $V_{n+1}-V_n$ become unequal and the field cage fails in achieving its goal.

Figure 9A:
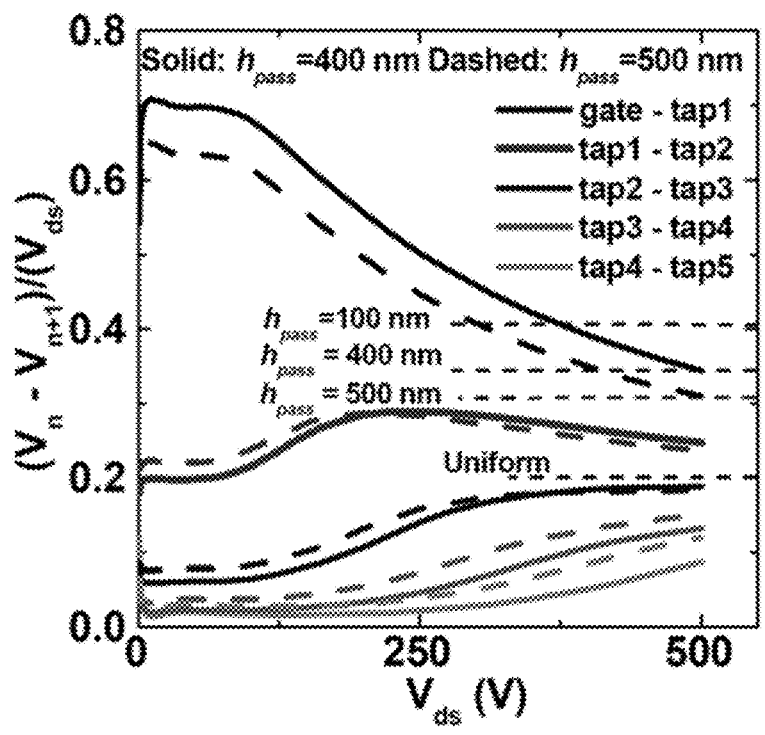
FIG. 9A-9C shows the effect of passivation thickness $h_{pass}$ on electric field distribution and voltage difference. Shown is FIG. 9A which are graphs for the voltage difference $(V_n-V_{n+1})$ between consecutive taps as a fraction of $V_{ds}$ for $h_{pass}$=400 nm (solid lines) and $h_{pass}$=500 nm (dashed lines)
Figure 9B:
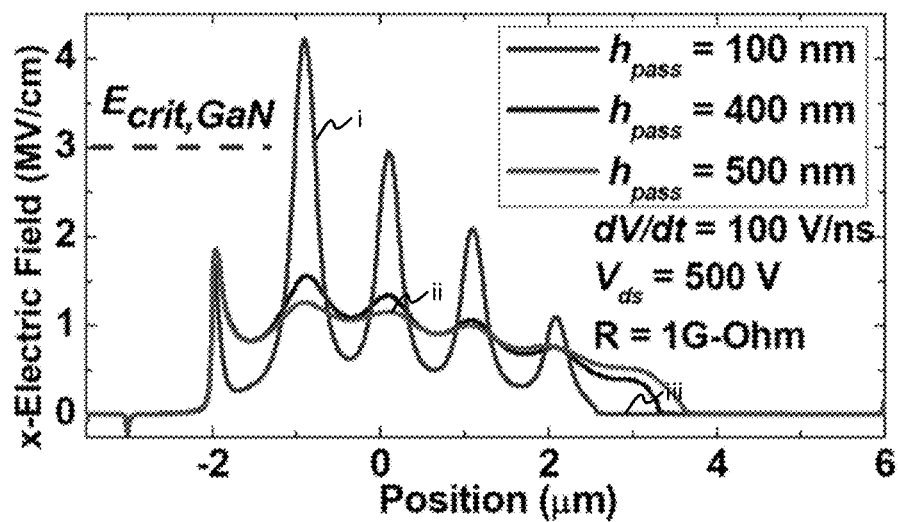
Figure 9C:
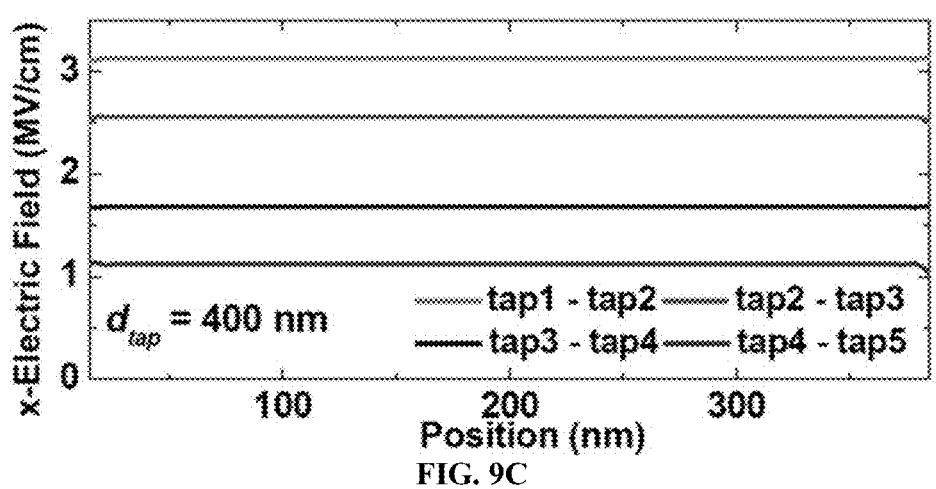

Reducing $I_{t-c}$ entails reducing $C_{t-c}$. This can be achieved by increasing the passivation thickness $h_{pass}$. FIG. 9A-9C shows results for the electric field distribution and voltage difference between consecutive taps as a fraction of the total $V_{ds}$ for increased passivation thicknesses (400 nm and 500 nm, compared to 100 nm in FIG. 7C) in the device with $d_{tap}$=400 nm. Increasing the passivation thickness drastically improves the electric field uniformity (FIG. 9B).

FIG. 9A shows $(V_{gate}-V_{tap1})/V_{ds}$ at $V_{ds}$=500 V at the end of the 5 ns ramp as dashed lines for the different passivation thicknesses (100, 400 and 500 nm). As FIG. 9A shows, even for a passivation thickness of 500 nm, the voltage difference between the gate and T1 is ~0.3 $V_{ds}$ (the voltage difference should be 0.2 $V_{ds}$ in the ideal case for a 5 tap structure (corresponding to the exact same voltage difference between all consecutive taps) as shown with a dashed line marked "uniform" on FIG. 9A). Thus, there is headroom for even more improvement in the electric field uniformity by increasing the passivation thickness further.

FIG. 9C plots the electric field at the surface of the passivation between consecutive taps for the device with $d_{tap}$=400 nm and thick passivation ($h_{pass}$=400 nm). Clearly, the electric field is reduced compared to the thin passivation case (FIG. 7D). Thus, both excellent uniformity of electric field (from DC in FIG. 6 to dV/dt=100 V/ns in FIG. 9B) and low electric field in the passivation dielectric are simultaneously achieved by implementing a field cage with R=1 GΩ and optimizing the tap-to-channel capacitance $C_{t-c}$ and tap-to-tap capacitance $C_{t-t}$.

Figure 10:
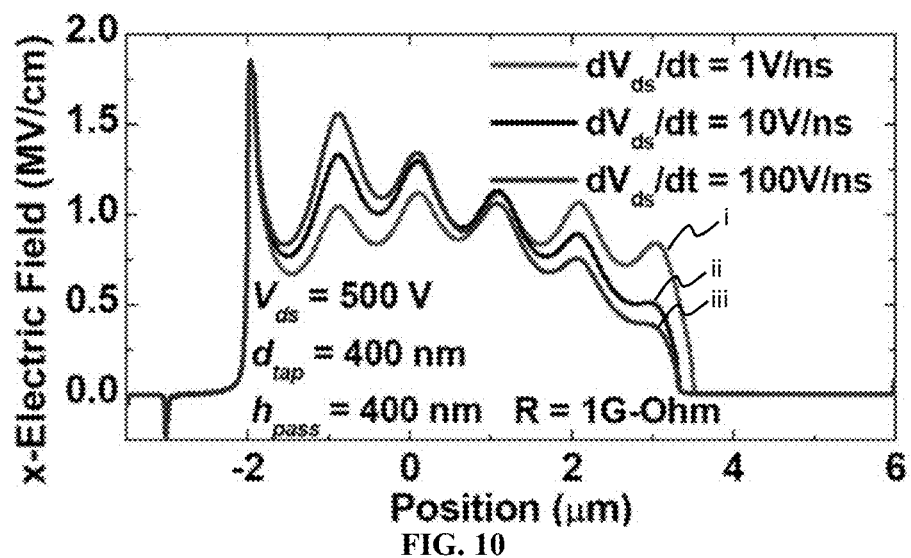
FIG. 10 is a graph showing the effect of dV/dt. Shown are electric field profiles from source to drain for $V_{ds}$=500 V for a drain field cage for dV/dt=100 V/ns (labeled "iii"), 10 V/ns (labeled "ii"), and 1 V/ns (labeled "i"). For this cage, tap pitch=1 μm, $d_{tap}$=400 nm, and $h_{pass}$=400 nm.

It should be remembered here that the passivation thickness required is dependent on the frequency of operation desired. The 100 V/ns is a high ramp rate in reverse recovery compared to any commercial device with $V_{br}$~500 V. For smaller and more realistic ramp rates such as 10 V/ns or 1 V/ns, the electric field uniformity is much better even for $h_{pass}$=400 nm (FIG. 10).

Figure 11:
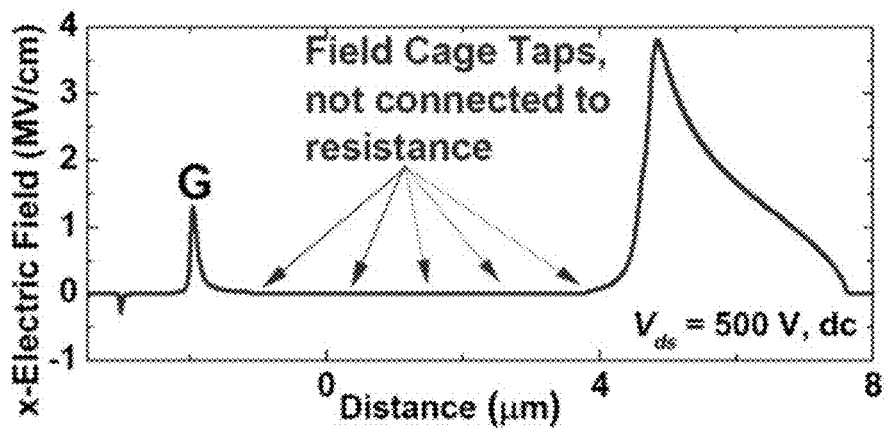
FIG. 11 is a graph showing an electric field profile from source to drain for $V_{ds}$=500 V (DC) for a drain field cage with open circuit taps (not connected to a finite resistance). For this cage, tap pitch=1 μm, $d_{tap}$=400 nm, and $h_{pass}$=400 nm. As can be seen, this structure failed to distribute the electric field.

Although the results might suggest that optimization of $C_{t-c}$ and $C_{t-t}$ is sufficient to achieve uniform electric field and the resistors are redundant, this is not the case. Under DC conditions, if a structure having the field cage taps is used without connecting to a finite resistance, it fails to distribute any electric field (FIG. 11). This is because in the absence of any displacement current, taps unconnected to a finite resistance (which are defined on a thick layer of insulating material) have infinite impedance and cannot allow any voltage drop between them. Although the devices in question are mostly employed in circuits where they switch at high frequency for most of the time, the DC operation cannot be ignored—the devices will block voltage in the OFF-state for time periods substantially longer than duration of the ON-to-OFF transient (e.g., roughly 5 µs for a switching frequency of 100 kHz at 50% duty cycle). Therefore, the resistor and its connectivity to the field cage taps has to be considered.

Figure 12:
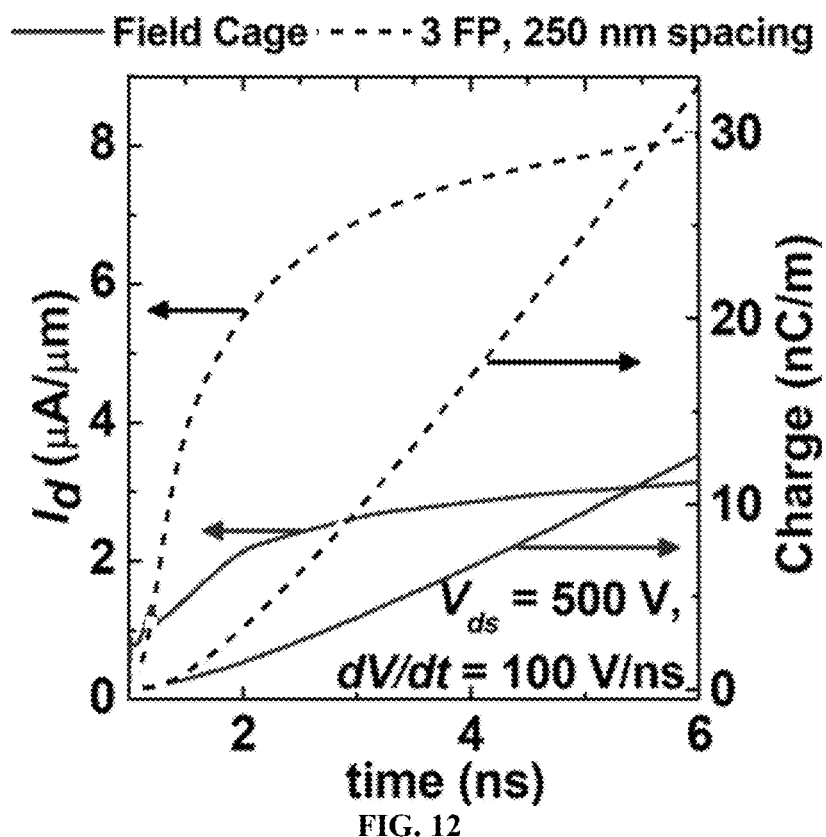
FIG. 12 is a graph comparing drain current and integrated current (charge) during ramping of $V_{ds}$ for a device having a drain field cage and a reference device having 3 horizontally spaced field plates. Shown is data for ramping from $V_{ds}$=0 to $V_{ds}$=500 V at dV/dt=100 V/ns. The devices included a DFC device with tap pitch=1 μm, $d_{tap}$=400 nm, and $h_{pass}$=400 nm (solid lines) and a reference device with three field plates spaced horizontally by 250 nm (dashed lines, where this reference device is the same device as curve labeled "i" in FIG. 3C).

In addition to superior field control, the field cage also reduced the current during switching to the OFF-state. FIG. 12 shows the drain current as the device ramps to the OFF-state from 0 to 500 V over a period of 5 ns (t=1 ns to t=6 ns). The field cage significantly reduced the current during drain bias ramp compared to the 3 field plate device with 250 nm spacing (recall FIG. 3A and FIG. 3C). This is because the switching current during the fast drain voltage ramp is influenced most strongly by gate-to-drain capacitance $C_{gd}$. For the 3 field plate device in FIG. 3C, the entire voltage drop occurs over a shorter distance, making gate-to-drain capacitance larger and increasing the switching current. Even after adding the current in the field cage resistors (500 V/5 GΩ=100 nA), spreading the electric field out over a larger distance results in lower switching current, in addition to improved breakdown voltage and reduced reliability concerns.

To realize the field cage resistance, the following points need to be considered, apart from achieving the intended resistance: a) ease of making good ohmic contacts on a lightly doped resistor material, b) breakdown voltage of the material, and c) compatibility with the given material system. Most commercial GaN technologies for power switching prefer silicon substrates for cost competitiveness. Silicon is also a material with a very well developed technology for fabricating Ohmic contacts. A 100 nm×100 nm bar of p-type silicon doped at $10^{16}$ cm$^{-3}$ has a resistance of 1.25 GΩ/mm, assuming a hole mobility of 500 cm²/Vs. To realize a 5 GΩ field cage like the one simulated above, such a resistive element in silicon would have to be 4 mm long, resulting in a field of 1.25 kV/cm in silicon, well below the breakdown voltage of 300 kV/cm.

In some instances, the resistive element may require protection from thermal fluctuations as well as from coupling with the electric fields in the device. Therefore, one could selectively etch the epitaxial GaN away in a region along the edge of the die to expose the silicon and fabricate the resistive element there using implant doping.

The resistive element contacts may be routed to the individual device fingers using vias and a two metal level scheme. For a 500 V device carrying ~10-20 A of current, the standard die size is ~0.5 cm×0.5 cm, and hence the area required by the resistive element is a very small fraction (less than 0.1%) of the die area.

Another useful material for the resistor could be p-type AlGaN with a high Al mole fraction. The low hole mobility allows for a high resistance even when the doping is significantly higher than that of silicon (see, e.g., Nakarmi M L et al., "Enhanced p-type conduction in GaN and AlGaN by Mg-δ-doping," *Appl. Phys. Lett.* 2003 May; 82(18):3041-3; and Li J et al., "Optical and electrical properties of Mg-doped p-type $Al_xGa_{1-x}N$," *Appl. Phys. Lett.* 2002 February; 80(7):1210-2). The advantages of high Al content AlGaN as a resistive element are higher breakdown voltage, and elimination of etching the epitaxial GaN to define the resistive element. One potential disadvantage is a relatively less-mature Ohmic contact technology and the fact that dopants tend to have higher activation energies, introducing the risk of thermal instability.

Titanium nitride (TiN) is another material that can be deposited to achieve a large range of resistivities (depending on the Ti content). However, there are not many detailed studies of high field conduction of highly resistive TiN, which is an important consideration for the field cage. Additional materials and methods of making field cages are described herein.

We have demonstrated a distributed impedance field shaping structure that shows excellent prospects for improving the unipolar Figure-of-Merit and voltage scalability for the lateral AlGaN/GaN HEMT. Through careful design optimization, the structure was shown to achieve excellent electric field control over a range of dV/dt=0 (DC) to 100 V/ns. The superior control of electric field is accompanied by reduced switching loss.

Example 2: Electric Field Control in Lateral Power Transistors Employing Resistive Field Plates Over the last decade, the Wide-Bandgap (WBG) semiconductor Gallium Nitride (GaN) has seen widespread use in both Radio-Frequency (RF) and optoelectronic devices. More recently, it has been considered for power switching devices. This is primarily due to its high critical electric field, which at 3 MV/cm is roughly ten times higher than that of the dominant material presently used for power semiconductor switches, silicon (Si). Indeed, the commonly cited Baliga Figure-of-Merit (BFOM) which weighs the voltage-blocking capability vs. the specific on-state resistance (i.e. the area-normalized on-state resistance) of a unipolar power diode, and which depends solely on material properties, is much higher for GaN than for Si (see, e.g., Hudgins J L et al., "An assessment of wide bandgap semiconductors for power devices," *IEEE Trans. Power Elec.* 2003 May; 18(3): 907-14).

In a power conversion circuit, semiconductor devices act as switches, and ideally alternately act as an open-circuit (off-state) and a short-circuit (on-state). Of course, no device is ideal. In the off-state, a device that can block as high a voltage as possible is desired, so a large breakdown voltage is sought. In the on-state, the device can to first order be modeled as a resistor, and as small a resistance as possible is desired to minimize power loss, so a small value of specific on-resistance is desired. A fundamental trade-off exists between these two properties—thicker material (the so-called "drift region") is required to block higher voltage, but thicker material leads to larger resistance. In particular, GaN exhibits high breakdown voltage and low specific on-state resistance, as compared to Si. It is also apparent that real GaN devices fall short of the GaN limit. This is because this limit is calculated for an ideal infinite planar junction, and electric field-crowding effects can lead to premature breakdown. Thus, the present disclosure is also directed to methods and structures that minimize these field-crowding effects.

Strictly speaking, the BFOM applies only to unipolar, vertical-architecture power devices. A "vertical" power device is one in which the electric field is primarily perpendicular to the surface of the semiconductor wafer. Likewise, the primary direction of current flow is in this direction. This is the dominant architecture for conventional Si devices as well as devices fabricated from Silicon Carbide (SiC), which is a WBG materials that is presently competing with GaN. Bipolar devices (i.e., devices in which current conduction occurs due to both electrons and holes, such as PiN diodes) are also prevalent in both Si and SiC, and technically the BFOM does not apply to these devices; the on-state resistance of such a device is theoretically lower than a comparable unipolar device, due to the injection of minority carriers into the drift region and the resulting "conductivity modulation."

However, from a practical point of view, the BFOM is often used to compare unipolar and bipolar devices despite the different physics of their operation. Other factors, such as contact resistance, may also be significant and in many cases obscure the differences in the physics of on-state conduction. In contrast to the situation for Si and SiC, device architectures in GaN are not common and in fact are quite new. This is because native GaN substrates have only recently become commercially available, and even now are quite expensive (see, e.g., Paskova T et al., "GaN substrates for III-nitride devices," *Proc. IEEE* 2010 July; 98(7):1324-38). Thus, GaN-based power devices are an area that is ripe for development.

Since GaN substrates have not been widely available, most GaN power devices to date have utilized a lateral architecture grown on a mis-matched non-native substrate such as sapphire, Si, or SiC (Su M et al., "Prospects for the application of GaN power devices in hybrid electric vehicle drive systems," *Semicond. Sci. Technol.* 2013; 28:074012). In such a structure, which is adapted from GaN RF devices, both the electric field and the current flow are primarily in a direction that is parallel to the surface of the semiconductor wafer. Thus, the device avoids the highly defective region at the substrate-GaN interface.

Lateral GaN power devices are actually heterostructure devices based on the AlGaN/GaN heterointerface, where the AlGaN layer sits above the GaN layer and typically contains 25-30% Al. The two-dimensional electron gas (2DEG) that spontaneously forms at the heterointerface has high mobility (typically 1500-2000 $cm^2/Vs$) and thus results in high current density. However, such a structure is inherently less capable of blocking large electric fields as well as handling large amounts of power. This is due not only to the lateral geometry and lack of a p-n junction, but also due to the fact that the active regions of the device are near the surface of the material. Electric field control in such structures is therefore quite challenging, and several approaches to this were studied, as described herein.

Lateral GaN-based power devices can be thought of as adaptations of RF AlGaN/GaN HEMTs (see, e.g., Mishra U K et al., "AlGaN/GaN HEMTs—An overview of device operation and applications," *Proc. IEEE* 2002; 90(6):1022-31), with the chief difference being that the gate-to-drain region (sometimes referred to as the "access region") is elongated to support the high voltage applied during the blocking state; typical values of the gate-to-drain spacing $L_{GD}$ are on the order of tens of microns (Lu B et al., "High breakdown (>1500 V) AlGaN/GaN HEMTs by substrate-transfer technology," *IEEE Electron Device Lett.* 2010 September; 31(9):951-3). We have developed a 600 V AlGaN/GaN power switching HEMT. Strictly speaking, such devices are not expected to obey the BFOM, since the geometry and physics of the device are quite different from the simple one-dimensional unipolar drift region that is typically assumed when determining BFOM.

Nevertheless, making suitable approximations, one can show that for AlGaN/GaN HEMTs the ratio of the breakdown voltage $V_B$ squared to the specific on-resistance $R_{ON,SP}$ is given by the following equation (Zhang N, "High-voltage GaN HEMTs with low on-resistance for switching applications," *Ph.D. Dissertation* in Electrical and Computer Engineering for University of California, Santa Barbara (September 2002):

$$\frac{V_B^2}{R_{ON,SP}} = q \times \mu_{n,ch} \times n_{ch}(E_C^2 - E_P^2), \quad (Eq. 1)$$

where q is the electron charge, $\mu_{n,ch}$ is the electron mobility in the channel (2DEG) at the AlGaN/GaN interface (this is in general not equal to the bulk mobility $\mu_n$), $n_{ch}$ is the sheet electron density in the channel (cm$^{-2}$), $E_C$ is the critical field in the AlGaN barrier layer, and $E_P$ is the polarization electric field in the AlGaN barrier.

Eq. 1 can be referred to as the "Lateral Figure of Merit" (LFOM) and is the analogue of the BFOM for lateral power devices. The last term in Eq. 1 is included because the III-N semiconductors are strongly polar materials, and a large electric field arises in the AlGaN barrier due to both spontaneous and strain-induced piezoelectric polarization. The 2DEG density $n_{ch}$ is typically on the order of $10^{13}$ cm$^{-2}$ and can be achieved in the absence of intentional doping, leading to high channel mobility due to absence of impurity scattering (hence the name "High Electron Mobility Transistor"); the channel electrons are believed to be due to surface donors (Ibbetson J P et al., "Polarization effects, surface states, and the source of electrons in AlGaN/GaN heterostructure field effect transistors," *Appl. Phys. Lett.* 2000; 77(2):250).

Eq. 1 implies that high channel electron mobility and density are essential to achieving a high LFOM. Additionally, a large difference between the critical and polarization electric fields is essential; note also that here the LFOM depends on the square of the critical field, not the third power as is the case for the BFOM. However, $n_{ch}$ is not a simple material constant, and it may be shown that $n_{ch}$ is proportional to $E_C$, thus restoring an approximate third-power dependence of the LFOM on the critical electric field.

Unlike the case for vertical GaN devices, lateral GaN-based HEMTs do not exhibit avalanche breakdown, but rather suffer increasing leakage current under high blocking voltage until catastrophic failure occurs (Meneghesso G et al., "Reliability of GaN high-electron-mobility transistors: State of the-art and perspectives," *IEEE Trans. Devices Mater. Rel.* 2008 June; 8(2):332-42). This is a significant problem for power conversion systems where designs often assume that power devices can sustain reversible (i.e. non-destructive) avalanche breakdown. This could be due to high surface leakage, breakdown of passivating dielectrics, or other reasons.

In general, breakdown is believed to occur near the drain-side edge of the gate, where the surface electric field tends to be peaked (Karmalkar S et al., "Enhancement of breakdown voltage in AlGaN/GaN high electron mobility transistors using a field plate," *IEEE Trans. Electron Devices* 2001 August; 48(8):1515-21). The non-uniform electric field distribution leads to a lack of scaling of the breakdown voltage with the gate-to-drain spacing. Because the field is peaked near the gate, most of the voltage drops in this region (recall that in a simple one-dimensional approximation, the voltage is the area under the field vs. distance plot). Beyond a certain point, extending $L_{GD}$ (i.e., the length or distance between the gate and the drain) does nothing to improve $V_B$ (although it will increase $R_{ON}$ and the amount of area consumed by the device, both of which are undesirable). The lack of scaling of the breakdown voltage with the device geometry implies that a lateral power device with a sharply peaked internal electric field distribution is limited in terms of the maximum breakdown voltage that may be attained. Thus, its applications space is likewise limited, and indeed most lateral GaN-based power HEMTs being developed today are intended for the 600 V device market (Shenai K et al., "Current status and emerging trends in wide bandgap (WBG) semiconductor power switching devices," *ECS J. Solid State Sci. Technol.* 2013; 2(8):N3055-63). The achievement of higher-voltage lateral GaN-based power switching devices thus requires the use of field-shaping techniques.

To date, field control in AlGaN/GaN power HEMTs has been achieved exclusively through the use of metallic field plates (see, e.g., Karmalkar S et al., "Enhancement of breakdown voltage in AlGaN/GaN high electron mobility transistors using a field plate," *IEEE Trans. Electron Devices* 2001 August; 48(8):1515-21). As the name implies, these are metal plates that are connected to the source and/or drain terminals (or sometimes both, see, e.g., Chu R et al., "1200-V normally off GaN-on-Si field-effect transistors with low dynamic ON-resistance," *IEEE Electron Device Lett.* 2011 May; 32(5):632-4) that overhang the gate. This is schematically illustrated in FIG. 3B, which shows three gate-connected field plates as well as the resulting electric field distribution in FIG. 3D.

Figure 3D:
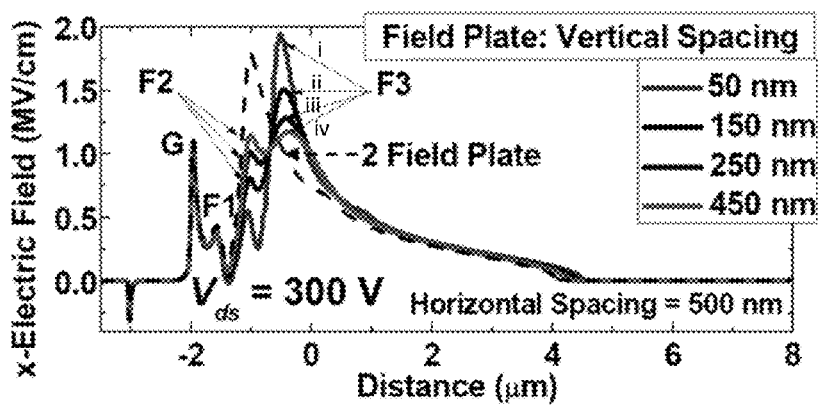

As is evident from FIG. 3D, while the peak electric field is reduced compared to what it would be with no field plates, the use of field plates does not completely eliminate the electric field peak. Indeed, the plates tend to push the peak to the edge of the last field plate, while leaving smaller peaks at the gate edge and at the edges of the plates closer to the gate. The resulting distribution is far from the ideal flat distribution. Here, we describe several novel approaches to achieve a more uniform internal electric field distribution. This in turn is expected to lead to better voltage scaling and the ability to achieve higher-voltage GaN power HEMTs.

The present disclosure relates, in part, to a resistive field plate ("RFP"), which is a continuous resistive material deposited between the gate and the drain. The RFP is the limiting case of the field cage (e.g., described in Example 1 herein), where the number of taps approaches infinity and the resistance between each tap approaches zero. This approach has been suggested previously for Si devices (see, e.g., Jaume D et al., "High-voltage planar devices using field plate and semi-resistive layers," *IEEE Trans. Electron Devices* 1991 July; 38(7):1681-4), but to our knowledge has never been applied to AlGaN/GaN HEMTs.

Figure 14A:
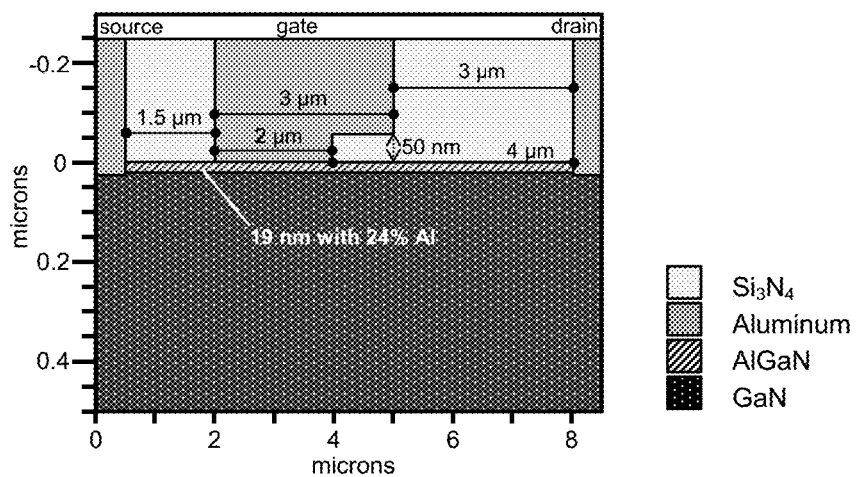
FIG. 14A-14B shows an exemplary resistive field plate. Provided are FIG. 14A which is a cross-section of a standard HEMT and FIG. 14B which is an identical structure in which a portion of the passivation layer between the gate and drain contacts has been replaced by a resistive field plate having a resistivity $\rho=10^8$ Ω·cm.
Figure 14B:
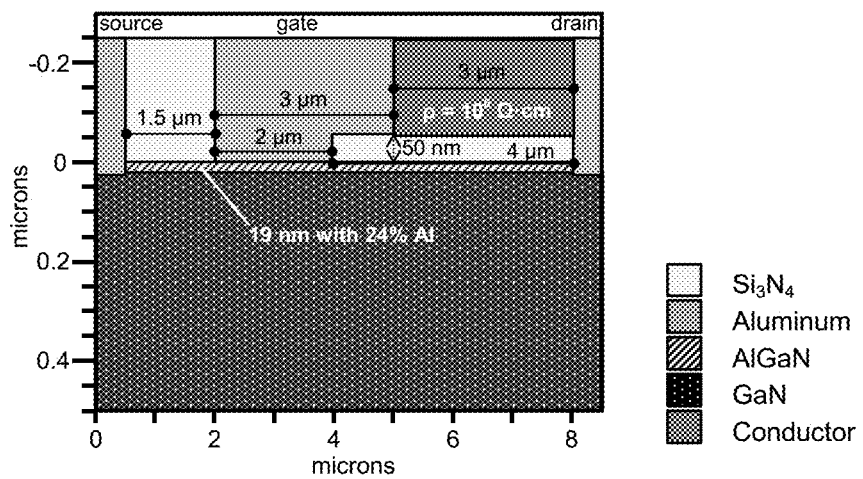

An exemplary RFP architecture is illustrated in FIG. 14A-14B. FIG. 14A shows an exemplary standard AlGaN/GaN power HEMT, and FIG. 14B shows a structure that is identical in all respects except that a portion of the passivation layer between the gate and the drain has been replaced with a resistive material (in this example, $\rho=10^6$ $\Omega\cdot$cm). Similar to the field cage, the value of the resistivity must be chosen such that it is low enough to effectively modulate the electric field, but that it is also high enough to limit the leakage current.

Figure 15A:
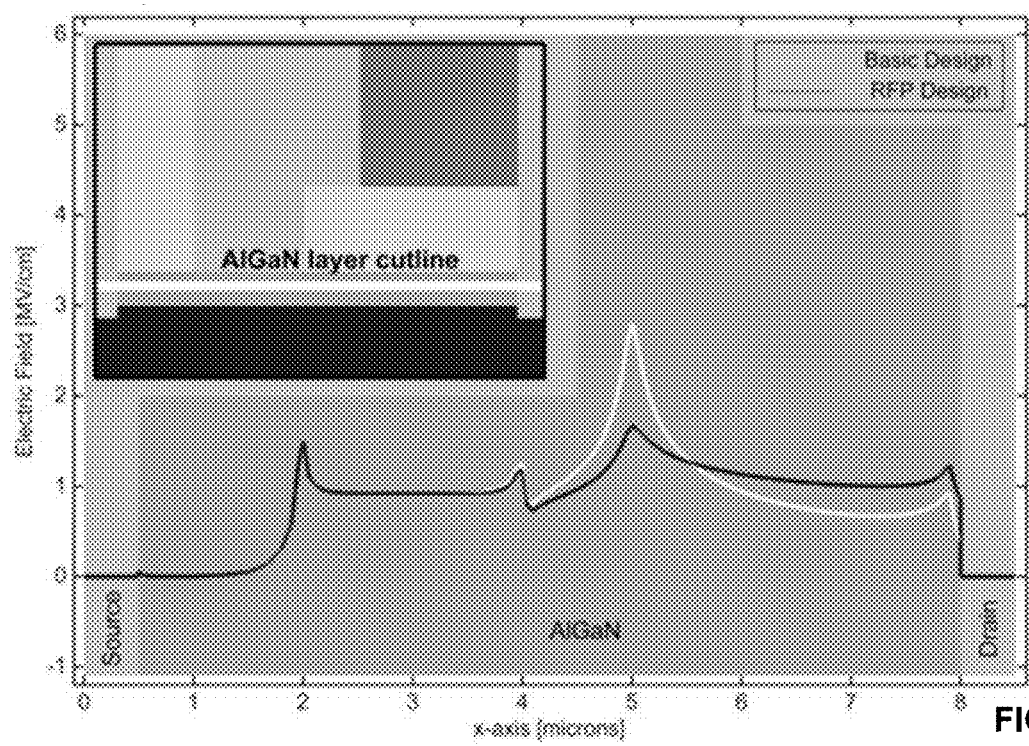
FIG. 15A-15C shows an exemplary resistive field plate (RFP) design, as compared to a conventional architecture. Provided are results from a numerical simulation of the electric field for both designs, including FIG. 15A which is a cross-section of the electric field along the cutline through the AlGaN barrier layer, as well as contour plots of the magnitude of the internal electric field for (FIG. 15B) the conventional design and (FIG. 15C) the exemplary RFP design shown in FIG. 14A-14B, respectively. The gate is indicated by a dashed white line on the left, and the drain is indicated by a dashed line on the right. Various components of the device are also indicated, including the RFP, SiN passivation layer, the AlGaN layer, and the GaN layer.
Figure 15B:
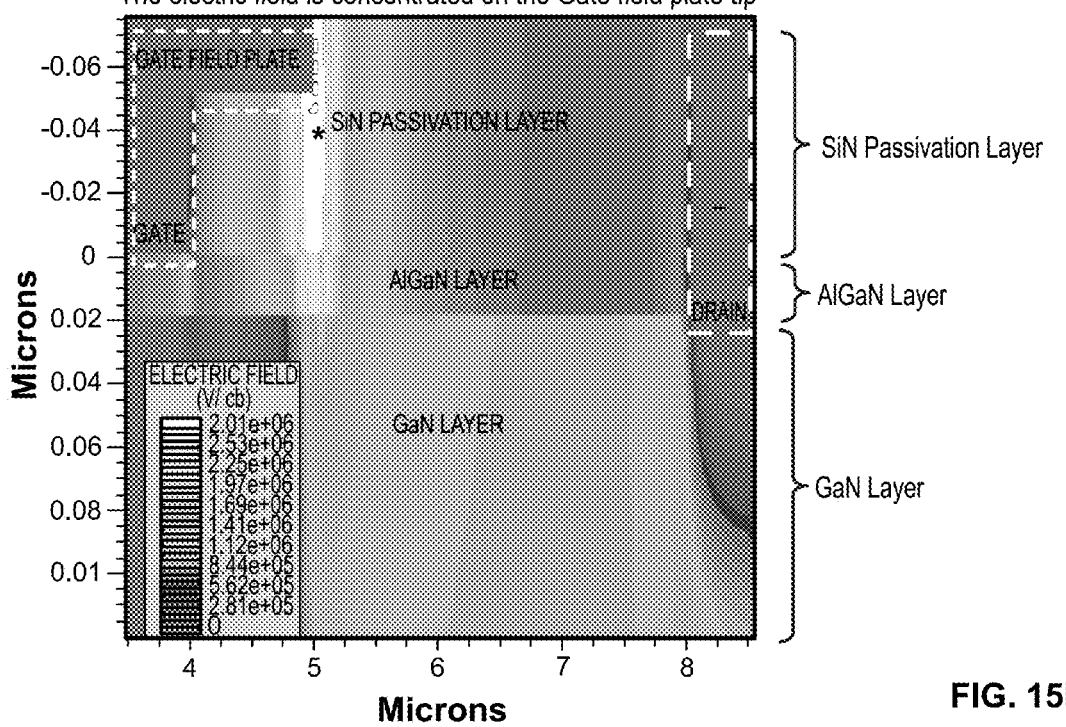
Figure 15C:
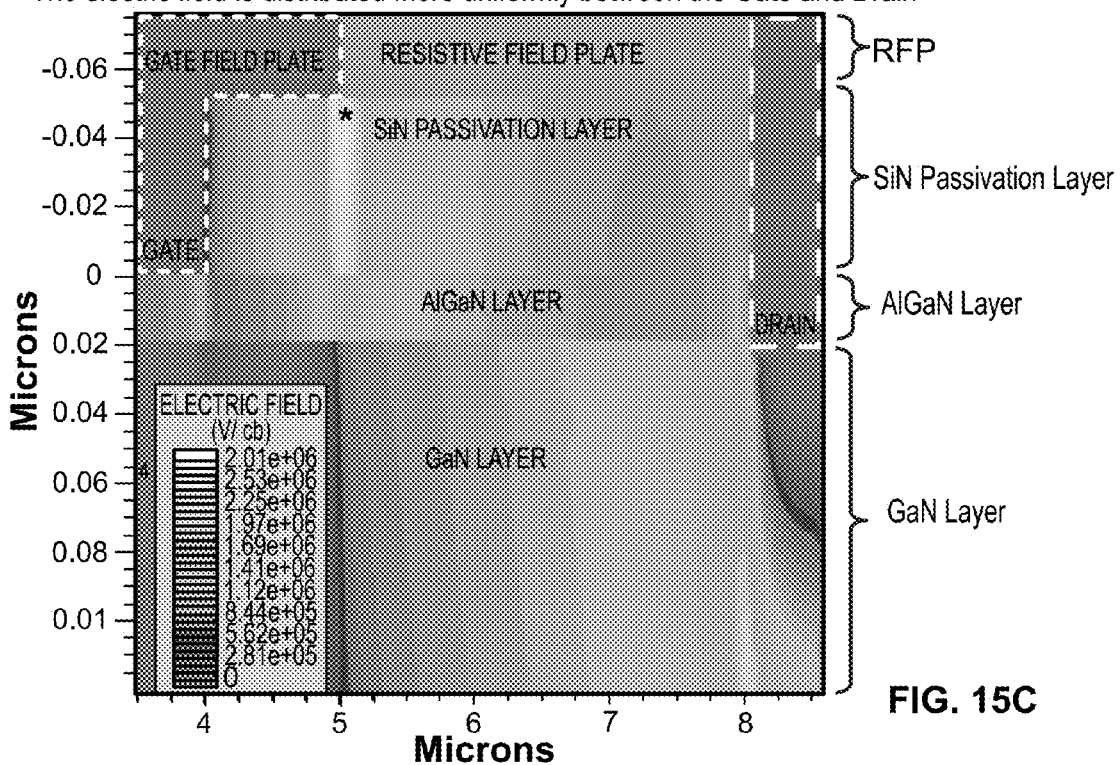

Numerical simulations were conducted based on the designs in FIG. 14A-14B, with the results shown in FIG. 15A-15C. Provided are contour plots of the magnitude of the internal electric field for a conventional design (FIG. 15B) and the exemplary RFP design (FIG. 15C). The key area to focus on is the area just below the edge of the gate field plate (the gate field plate is indicated by a white dashed line on the left of FIG. 15B-15C). Both the conventional and the RFP designs have a conventional overhanging gate field plate (i.e., having an overhanging horizontal portion connected to a vertical portion), which is the location of the maximum electric field. In the conventional design (FIG. 15B), it is seen that the electric field in this region is quite high (dark region to the right of the gate field plate, indicated by *), whereas for the RFP design the magnitude of the field is much lower (the color scales on both panels are the same, compare with * indicated in FIG. 15C). This effect is also observed in FIG. 15A, which shows the magnitude of the electric field plotted along a cutline through the AlGaN barrier layer. Clearly, the field peak is lower for the RFP design than for the conventional design, indicating that the RFP does indeed effectively control the electric field in the HEMT.

Similar to the field cage, the potential negative impact of the resistive field plate on the switching time of the HEMT is a concern. Switching effect can be studied using an approximate analytical model based on a transmission-line analogy. By considering the capacitance per unit length of the passivation layer and the resistance per unit length of the resistive layer, a diffusion equation describing the propagation of voltage from gate to drain can be derived as follows:

$$\frac{\partial V}{\partial t} = \frac{1}{R_L C_L} \times \frac{\partial^2 V}{\partial x^2}, \quad \text{(Eq. 2)}$$

where $R_L$ and $C_L$ are the aforementioned resistance and capacitance per unit length respectively. Note that since inductance is neglected, a diffusion equation rather than a wave equation results from the transmission-line analysis. The diffusion coefficient is given by $D=1/R_L C_L$ and has units of cm$^2$/s. As is well known in the mathematics of diffusion, the characteristic response time is given by $\tau=L^2 R_L C_L$, where L is the gate-to-drain separation. Considering the expressions for $R_L$ and $C_L$, one obtains the following:

$$\tau = \frac{L^2 \rho_{RFP} \varepsilon_{pass}}{h_{RFP} h_{pass}}, \quad \text{(Eq. 3)}$$

where $\rho_{RFP}$ is the resistivity of field plate, $\varepsilon_{pass}$ is the dielectric constant of the passivation layer ($Si_3N$ region below the RFP in the FIG. 14B), $h_{RFP}$ is the thickness of the resistive field plate, and $h_{pass}$ is the thickness of the passivation layer (e.g., $h_{pass}$=50 nm in FIG. 14B).

Calculations using Eq. 3 and expected values of the input variables suggest that the switching time of the resistive field plate could be high (microseconds or more). A possible way around this potential problem is to connect the RFP to the source rather than to the gate, as was done for the field cage; the gate-connected RFP was initially examined because the fabrication is simple—the resistive material may simply be deposited between the gate and the drain. However, for the gate-connected case, the large resistance and capacitance that must be directly driven by the gate slows the response, and circumventing the gate and connecting to the drain may alleviate this problem. Note that in the high-voltage blocking state, the gate-to-source voltage is much smaller than the drain-to-source voltage, and thus connecting the RFP (or the field cage) to the gate vs. the source has little impact on the resulting internal field profile. Thus, the present disclosure also encompasses use of the RFP connected to either the gate or the source. When connected to the source, the RFP can be disposed above the gate and separated by a dielectric or insulator layer (e.g., using any useful material, such as any insulating or passivation layer herein). Detailed design optimization via simulation as well as experimental verification can further examine the issue of the impact of the RFP on switching time.

Figure 16:
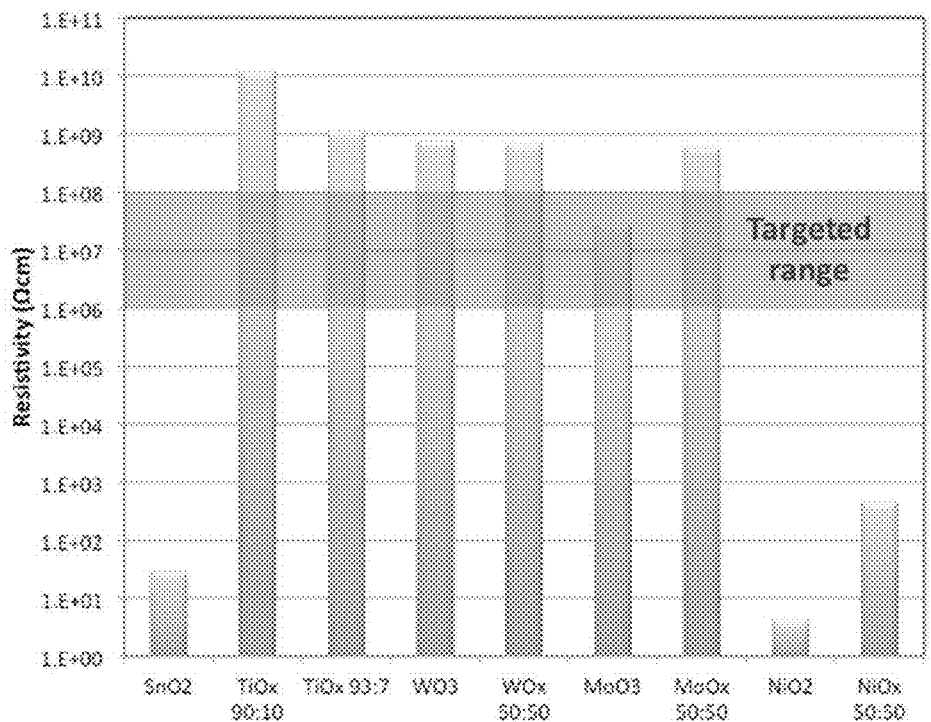
FIG. 16 is a graph providing resistivity values for stoichiometric and non-stoichiometric metal oxides, as well as the targeted resistivity range for a resistive field plate.

We also investigated a number of materials that could be suitable for the fabrication of the resistive field plate. A resistivity value between $10^6$ and $10^8$ $\Omega\cdot$cm was targeted based on device geometry and leakage current requirements. The initial focus was on stoichiometric and non-stoichiometric metal oxide films, and a chart showing the resistivities achieved is shown in FIG. 16. As is seen in this figure, only one of the oxides ($MoO_3$) lies within the targeted resistivity range, although a number of them are less than a factor of ten higher in resistivity.

Figure 17:
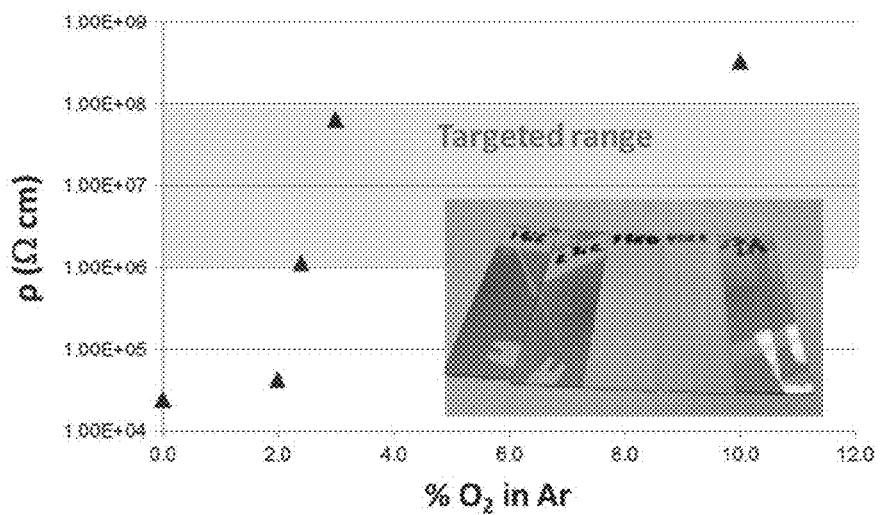
FIG. 17 is a graph showing resistivity values for SiC:O films grown using various $O_2$:Ar gas mixtures, as well as the targeted resistivity range for RFP applications. The inset shows several grown SiC:O films.

Given the possible difficulty in tuning the resistivity of these metal oxides within the desired range, we also explored using oxygen-containing SiC films (SiC:O) was explored. In this approach, an oxygen-argon mixture was introduced during SiC growth, with a higher concentration of oxygen leading to higher resistivity. It was found that roughly 3% oxygen in the oxygen-argon mixture resulted in a resistivity within the desired range. This is shown in FIG. 17, along with images of several of the grown SiC:O films. Integration of the RFP into the baseline HEMT process was begun by demonstrating Ohmic contacts (20 nm Ti/40 nm Pt/500 nm Au) on a number of the candidate films.

Accordingly, described herein are resistive field plates and design considerations to improve the electric field profile of a device, such as an HEMT. Various designs can be computationally simulated and experimentally tested using the methods described herein.

Example 3: Electric Field Control Using Lateral Charge Variation

As a mitigation against difficulties that may be encountered using the field cage and/or resistive field plate (e.g., in the case that the slowing of switching speed is too great), an alternative method of electric field control using lateral variation of charge density was investigated theoretically. Exemplary charge variation layers are described in, e.g., U.S. Pat. Pub. Nos. 2013-0313560, 2013-0313611, and 2013-0313612, each of which is incorporated herein by reference in its entirety. The basic ideas stems from the simple fact that charge is a source of electric field, and may be used to introduce a field that counters the field profile that results due to application of high voltage in the blocking state. This idea is illustrated using a simple analytical approximation. A schematic drawing of the device geometry is shown in FIG. 18A, where the sources of charge include spontaneous and piezoelectric polarization charge (shown as plus and minus signs within the AlGaN barrier layer), ionized surface donors (shown as plus signs on top of the AlGaN barrier layer), and 2DEG channel electrons (shown as minus signs in the GaN buffer layer).

Figure 18A:
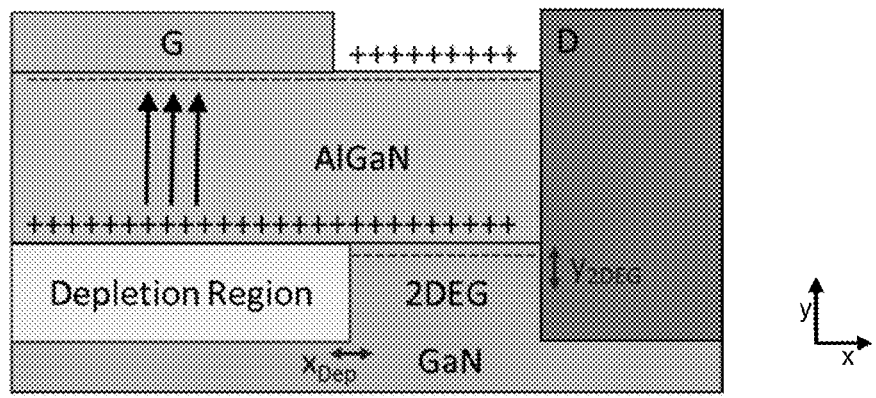
FIG. 18A-18C shows the effect of a charge variation layer on the electric field profile. Provided are FIG. 18A which is a schematic of device geometry used to construct an approximate analytical model for lateral charge variation (LCV) approach to electric field control.

Near the drain-side edge of the gate, the electric field $E_y$ in the vertical direction (y-direction in FIG. 18A, although provided as the z-direction in other figures herein) results from (i) the polarization charge, and (ii) the applied gate bias and the surface potential. The latter is due to the Schottky barrier under the gate and the ionized surface donors in the gate-to-drain region). This electric field $E_y$ in the vertical direction can be understood as follows:

$$E_y \approx \frac{\sigma_P}{\varepsilon_{AlGaN}} - \frac{V_G - \phi_S}{h_{AlGaN}}, \quad \text{(Eq. 4)}$$

where $\sigma_P$ is the polarization charge (C/cm$^2$), $\varepsilon_{AlGaN}$ is the dielectric constant of the AlGaN (F/cm), $V_G$ is the applied gate voltage (V), $\phi_S$ is the surface potential (V), and $h_{AlGaN}$ is the thickness of the AlGaN (in the vertical direction or in the y-direction in FIG. 18A).

Similarly, in the same region the electric field in the horizontal direction (x-direction in FIG. 18A) is due to (i) the transition from the 2DEG between the gate and the drain and the depleted region under the gate (the charge density there is assumed to be negligible, due to the unintentional, low doping) and (ii) the applied drain bias. This electric field $E_x$ in the horizontal direction can be understood as follows:

$$E_x \approx \frac{q \times n_{2DEG} \times x_{Dep}}{\varepsilon_{AlGaN} \times y_{2DEG}} - \frac{V_D}{L_{GD}}, \quad \text{(Eq. 5)}$$

where q is the electron charge (C), $n_{2DEG}$ is the channel electron density (cm$^{-2}$), $x_{Dep}$ is the transition distance between the channel and the depletion layer in the horizontal direction (cm), $\varepsilon_{AlGaN}$ is the dielectric constant of the AlGaN (F/cm), $y_{2DEG}$ is the approximate thickness of the channel (cm), $V_D$ is the applied drain bias (V), and $L_{GD}$ is the gate-to-drain separation in the horizontal direction (cm). The total electric field must remain below the critical field $E_{Crit}$:

$$\sqrt{E_x^2 + E_y^2} < E_{Crit}. \quad \text{(Eq. 6)}$$

It is seen that reducing the polarization charge $\sigma_P$ reduces the vertical field. Further, reducing $\sigma_P$ reduces the horizontal field, since the 2DEG density depends on the polarization:

$$n_{2DEG} = \frac{C_{AlGaN}}{q}\left(V_G - \phi_S + \frac{\Delta E_C}{q} + \frac{\sigma_P h_{AlGaN}}{\varepsilon_{AlGaN}}\right), \quad \text{(Eq. 7)}$$

where $C_{AlGaN}$ is the capacitance per unit area of the AlGaN layer (C/cm$^2$), q is the electron charge (C), $V_G$ is the applied gate voltage (V), $\phi_S$ is the surface potential (V), $\Delta E_C$ is the band offset at the AlGaN/GaN interface (eV), $\sigma_P$ is the polarization charge (C/cm$^2$), $h_{AlGaN}$ is the thickness of the AlGaN (in the vertical direction or in the y-direction in FIG. 18A), and $\varepsilon_{AlGaN}$ is the dielectric constant of the AlGaN (F/cm).

Of course, reducing $n_{2DEG}$ also increases the on-state resistance of the device, so a trade-off exists between high breakdown voltage (achieved by decreasing $\sigma_P$) and low on-state resistance (achieved by increasing $\sigma_P$). One approach to this optimization problem is to selectively change $\sigma_P$ such that it is low in the region of highest electric field near the gate edge, but high elsewhere along the channel. Indeed, the optimum way to do this is to continuously grade the polarization charge along the gate-to-drain region, such that it is low at the gate and high at the drain. In terms of fabrication, this could be achieved by a number of means, e.g. by laterally varying the strain state of the AlGaN layer (perhaps by depositing a passivating film of varying thickness on top of the AlGaN), such that the piezoelectric polarization component changes along the channel.

Figure 18B:
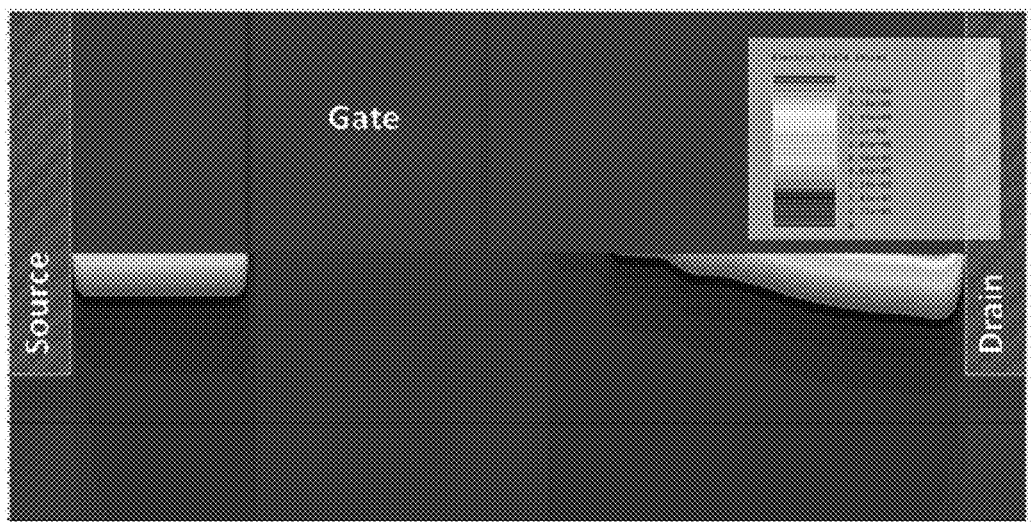

A representative simulation result is shown in FIG. 18B, where $\sigma_P$ was graded in a step-wise fashion every 5 μm, starting at zero at the gate and moving to its normal value for a fully-strained coherent AlGaN layer on GaN at the drain. It is seen that there is no peak in the electric field at the edge of the gate. Indeed, the maximum field is actually near the drain rather than the gate. This demonstrates that the approach is theoretically feasible.

Figure 18C:
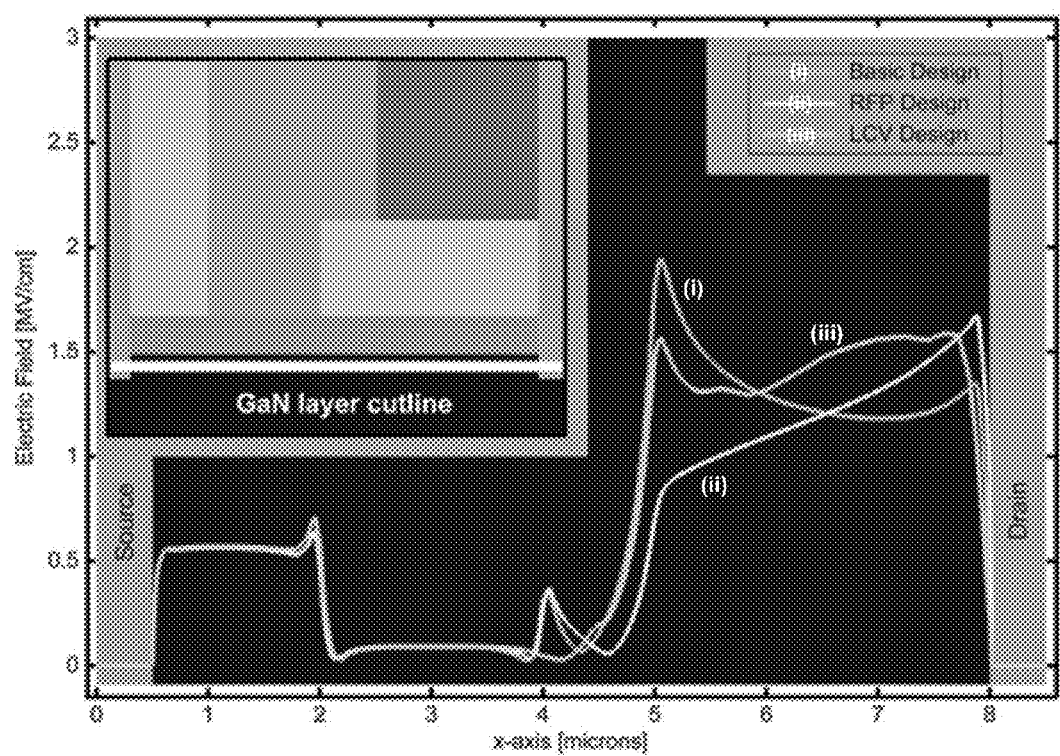

A plot of the electric field along a cutline in the GaN just below the 2DEG for the baseline device as well as for representative resistive field plate (RFP) and lateral charge variation (LCV) field-control cases is shown in FIG. 18C. For the cases shown the flattest field profile is for the LCV, but the exact result of course depends on many details as to how each field-control scheme is implemented. These studies show that both the RFP and LCV approaches to field control appear to be feasible.

Example 4: Considerations of Field-Driven Reliability

Control of the electric field within the device is critical not only to achieve high breakdown voltage, but is also important because degradation mechanisms are expected to be field-driven (Kaplar R J et al., "Impact of gate stack on the stability of normally-off AlGaN/GaN power switching HEMTs," *IEEE 26th Int'l Symp. on Power Semiconductor Devices & IC's*, held in Waikoloa, Hi. on 15-19 Jun. 2014 (pp. 209-12); and Khalil S G et al., "Trap-related parametric shifts under DC bias and switched operation life stress in power AlGaN/GaN HEMTs," *IEEE Intl Reliability Physics Symp.*, held at Waikoloa, Hi. on 1-5 Jun. 2014 (pp. CD.4.1-CD.4.9)).

Preliminary experimental investigations of the electric field dependence of the reliability of AlGaN/GaN HEMTs were conducted. In these experiments, devices were stressed in the blocking state for varying periods of time. During stress, charge is trapped in the devices, and following stress this charge is released; this release is evaluated by measuring the drain current transient (DasGupta S et al., "Slow detrapping transients due to gate and drain bias stress in high breakdown voltage AlGaN/GaN HEMTs," *IEEE Trans. Electron Devices* 2012 May; 59(8):2115-22).

We observed that while the longer-time emission peak is temperature-dependent (the time constant follows an Arrhenius relationship consistent with simple thermal emission from a trap), the shorter-time emission peak (really a series of peaks) depends not on temperature but ion stress time. We believe that this dependence is linked to the electric field induced by the trapped charge, the density of which in turn depends on stress time. It seems clear that the device design and reliability are strongly coupled through the electric field.

Overall, described herein are structures and methods for the control of electric fields in III-N power devices. This included both experimental work, as well as device design and simulation capability.

Other Embodiments

All publications, patents, and patent applications mentioned in this specification are incorporated herein by reference to the same extent as if each independent publication or patent application was specifically and individually indicated to be incorporated by reference.

While the disclosure has been described in connection with specific embodiments thereof, it will be understood that it is capable of further modifications and this application is intended to cover any variations, uses, or adaptations of the disclosure following, in general, the principles of the disclosure and including such departures from the present disclosure that come within known or customary practice within the art to which the disclosure pertains and may be applied to the essential features hereinbefore set forth, and follows in the scope of the claims.

Other embodiments are within the claims.

The invention claimed is:

1. An apparatus comprising:
(i) a semiconductor device comprising a source, a gate, and a drain; and
(ii) a resistive field cage coupled to the semiconductor device, the resistive field cage comprising:
a resistive element, comprising a resistive material, electrically coupled between the source and the drain of the semiconductor device; and
a plurality of n field cage taps, n an integer at least 3 but not more than 20, disposed above the semiconductor device and between the source and the drain, wherein each of the n field cage taps is electrically coupled between a top surface of the semiconductor device and the resistive element;
wherein:
the plurality of n field cage taps comprises a first field cage tap located nearest the source followed by n-1 consecutive field cage taps disposed between the first field cage tap and the drain, an edge-to-edge distance $d_{tap}$ of at least 400 nm separating each of the n-1 consecutive field cage taps from a preceding field cage tap;
the semiconductor device further comprises a base substrate, a buffer layer disposed above the base substrate, a barrier layer disposed above the buffer layer, and a passivation layer disposed above the barrier layer, in which the buffer layer forms with the barrier layer a heterojunction configured to provide a channel region that accumulates a two-dimensional electron gas (2DEG);
the buffer layer has a composition comprising at least one substance selected from the group consisting of gallium nitride, gallium arsenide, indium nitride, indium phosphide, indium gallium nitrides, and aluminum indium gallium nitrides;
the passivation layer comprises one or more materials selected from the group consisting of silicon oxide, silicon nitride, silicon oxynitride, aluminum oxide, aluminum nitride, zinc oxide, zirconium oxide, hafnium oxide, titanium oxide, carbon-doped silicon oxide, carbon-doped silicon nitride, and carbon-doped silicon oxynitride;
the plurality of n field cage taps lie directly on or within the passivation layer; and
beneath the plurality of n field cage taps, the passivation layer has a thickness $h_{pass}$ of at least 400 nm but not more than 700 nm.

2. The apparatus of claim 1, wherein the resistive material comprises a p-type material, silicon, aluminum gallium nitride, tantalum nitride, and/or titanium nitride.

3. The apparatus of claim 1, wherein the resistive element comprises a film of the resistive material patterned on an insulator layer.

4. The apparatus of claim 1, wherein the resistive element comprises n resistors in series, and wherein each resistor is electrically coupled to one of the plurality of n field cage taps.

5. The apparatus of claim 1, wherein the resistive element has a resistance ranging from about 1 GΩ to about 10 GΩ.

6. The apparatus of claim 1, wherein dtap ranges from about 400 nm to about 500 nm.

7. The apparatus of claim 1, wherein a length of each field cage tap Ltap, ranges from about 500 nm to about 1000 nm.

8. The apparatus of claim 1, wherein the buffer layer comprises gallium nitride and the barrier layer comprises aluminum gallium nitride.

9. The apparatus of claim 1, wherein the plurality of n field cage taps is coupled to a top surface of the passivation layer.

10. The apparatus of claim 1, further comprising an insulator layer disposed beneath the passivation layer, and wherein the gate is disposed within the passivation layer and above the insulator layer.

* * * * *